(12) United States Patent
Yoshida et al.

(10) Patent No.: US 9,448,454 B2
(45) Date of Patent: Sep. 20, 2016

(54) ACTIVE MATRIX SUBSTRATE AND DISPLAY DEVICE

(71) Applicant: Sharp Kabushiki Kaisha, Osaka-shi, Osaka (JP)

(72) Inventors: Masahiro Yoshida, Osaka (JP); Isao Ogasawara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/438,678

(22) PCT Filed: Nov. 1, 2013

(86) PCT No.: PCT/JP2013/079730
§ 371 (c)(1),
(2) Date: Apr. 27, 2015

(87) PCT Pub. No.: WO2014/073486
PCT Pub. Date: May 15, 2014

(65) Prior Publication Data
US 2015/0301420 A1    Oct. 22, 2015

(30) Foreign Application Priority Data
Nov. 8, 2012    (JP) .................................. 2012-246030

(51) Int. Cl.
*H01L 29/10*    (2006.01)
*G02F 1/1362*    (2006.01)
(Continued)

(52) U.S. Cl.
CPC ....... *G02F 1/136286* (2013.01); *G02F 1/1345* (2013.01); *G02F 1/1368* (2013.01); *H01L 27/1225* (2013.01); *G02F 2001/13456* (2013.01); *G02F 2001/136254* (2013.01)

(58) Field of Classification Search
CPC ... H01L 27/1225; H01L 22/32; H01L 22/34; G02F 1/1345
USPC ........................................................ 257/43
See application file for complete search history.

(56) References Cited

U.S. PATENT DOCUMENTS

2008/0251787 A1* 10/2008 Kim ...................... H01L 22/32
257/48
2009/0153008 A1 6/2009 Yanagisawa et al.
(Continued)

FOREIGN PATENT DOCUMENTS

JP    2005-241988 A    9/2005
JP    2007-219046 A    8/2007
(Continued)

OTHER PUBLICATIONS

Official Communication issued in International Patent Application No. PCT/JP2013/079730, mailed on Jan. 28, 2014.

*Primary Examiner* — Andy Huynh
*Assistant Examiner* — Sitaramarao S Yechuri
(74) *Attorney, Agent, or Firm* — Keating & Bennett, LLP

(57) ABSTRACT

An active matrix substrate (5) is provided with mounting terminals (DT3), draw-out lines (22) connecting mounting terminals (DT4) and data bus lines (D), a first common wire (47) connected in common to the plurality of data bus lines (D), and second thin-film transistors (second switching elements) (45) connected between the draw-out lines (22) and the first common wire (47). End portions of the data bus lines (D) to which the mounting terminals (DT3) are not connected are connected to second common wires (54) via third thin-film transistors (52).

20 Claims, 12 Drawing Sheets

(51) Int. Cl.
  *G02F 1/1345* (2006.01)
  *G02F 1/1368* (2006.01)
  *H01L 27/12* (2006.01)

(56) References Cited

U.S. PATENT DOCUMENTS

2009/0174835 A1* 7/2009 Lee .................. G02F 1/1368
                                               349/46
2011/0018571 A1* 1/2011 Kim .................. G02F 1/1345
                                               324/760.02
2011/0260171 A1   10/2011 Yamazaki
2012/0056186 A1*  3/2012 Shirouzu .......... G02F 1/136204
                                               257/59

FOREIGN PATENT DOCUMENTS

| | | |
|---|---|---|
| JP | 2009-103872 A | 5/2009 |
| JP | 2009-145849 A | 7/2009 |
| JP | 2011-243972 A | 12/2011 |
| JP | 2013-148803 A | 8/2013 |

* cited by examiner

ACTIVE MATRIX SUBSTRATE AND DISPLAY DEVICE

TECHNICAL FIELD

The present invention relates to an active matrix substrate including gate bus lines and data bus lines, and to a display apparatus incorporating the same.

BACKGROUND ART

In recent years, for example, liquid crystal display apparatuses are widely used in liquid crystal televisions, monitors, mobile telephones, and the like as flat panel displays that are advantageously thin and lightweight compared to conventional cathode ray tubes. In some known examples of such liquid crystal display apparatuses, a liquid crystal panel serving as a display panel incorporates an active matrix substrate. In an effective display region of the active matrix substrate, a plurality of data bus lines (source wires) and a plurality of gate bus lines (scan wires) are arranged in a matrix pattern. Switching elements, such as thin-film transistors (TFTs), are arranged in the vicinity of intersections between the data bus lines and the gate bus lines. In the effective display region, pixels having pixel electrodes connected to the switching elements are arranged in a matrix pattern.

As is known in the art, in concert with downsized frames of liquid crystal display apparatuses, the aforementioned conventional active matrix substrate has inspection thin-film transistors, which are arranged in the vicinity of a portion on which a driver chip (IC chip) of a data driver (source driver) and/or a gate driver is mounted, for the purpose of inspecting the corresponding data bus lines or gate bus lines.

Furthermore, with regard to the conventional active matrix substrate, it has been suggested to provide a first portion and a second portion to a portion on which the driver is mounted, as described in, for example, the below-listed Patent Document 1. Here, the first portion contains ITO (upper-layer terminal electrodes of mounting terminals) connected to bumps of the driver and includes terminal contact holes for connecting ITO and the corresponding data bus lines or gate bus lines, whereas the second portion contains only ITO. It has been considered that this conventional active matrix substrate enables formation of the mounting terminals in the portion on which the driver is mounted, even if a wiring pitch of the data bus lines and/or the gate bus lines is reduced in accordance with high-definition properties of liquid crystal display apparatuses.

PRIOR ART DOCUMENTS

Patent Document

[Patent Document 1] JP 2009-145849A

DISCLOSURE OF INVENTION

Problem to be Solved by the Invention

However, in many cases, a region of the portion on which the driver is mounted, i.e., a driver mounting region is small (a driver IC chip is small) on the aforementioned conventional active matrix substrate. Therefore, it is often the case that there is no sufficient space for wires and elements that are provided outside the effective display region, such as inspection thin-film transistors and inspection wires. Consequently, there are cases in which there is no choice but to reduce the functions by reducing the wires and elements outside the effective display region.

In view of the above, the present invention aims to provide an active matrix substrate on which wires and elements outside a display region can be efficiently installed while preserving their functions, even if a region for mounting a driver is small, as well as a display apparatus incorporating such an active matrix substrate.

Means for Solving Problem

An active matrix substrate according to an example of the present invention includes: a base member; a plurality of gate bus lines provided on the base member; a plurality of data bus lines provided in a layer different from a layer of the gate bus lines via an insulating film therebetween; a first switching element connected to the gate bus lines and the data bus lines; a mounting terminal for supplying a signal from a driver to the gate bus lines or the data bus lines; a plurality of draw-out lines connecting the mounting terminal and the gate bus lines or the data bus lines; a plurality of second switching elements that are each connected to a corresponding one of the plurality of draw-out lines; a first common wire connected in common to at least two of the plurality of second switching elements; a plurality of third switching elements connected to end portions of the gate bus lines or the data bus lines to which the mounting terminal is not connected; and a second common wire connected in common to at least two of the plurality of third switching elements.

Effects of the Invention

According to the embodiments of the invention of the present application, wires and elements outside a display region can be efficiently installed while preserving their functions, even if a region for mounting a driver is small.

DESCRIPTION OF THE INVENTION

Figure 1:
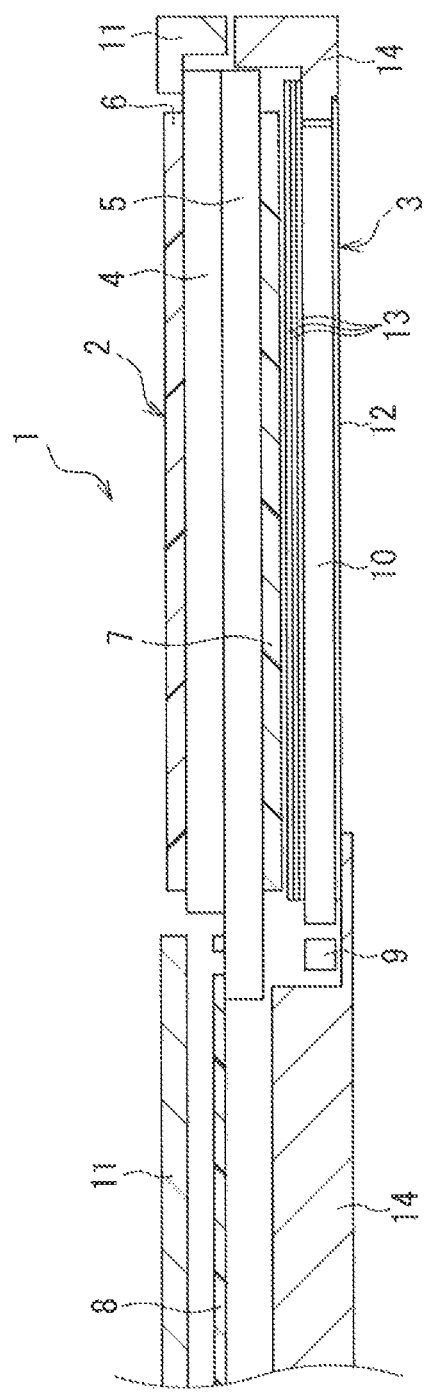
FIG. 1 is a diagram for describing an example of a liquid crystal display apparatus incorporating an active matrix substrate according to a first embodiment of the present invention.

An active matrix substrate according to an embodiment of the present invention includes: a plurality of gate bus lines; a plurality of data bus lines provided in a layer different from a layer of the gate bus lines via an insulating film therebetween; a first switching element connected to the gate bus lines and the data bus lines; a mounting terminal for supplying a signal from a driver to the gate bus lines or the data bus lines; a plurality of draw-out lines connecting the mounting terminal and the gate bus lines or the data bus lines; a plurality of second switching elements that are each connected to a corresponding one of the plurality of draw-out lines; a first common wire connected in common to at least two of the plurality of second switching elements; a plurality of third switching elements connected to end portions of the gate bus lines or the data bus lines to which the mounting terminal is not connected; and a second common wire connected in common to at least two of the plurality of third switching elements.

On the aforementioned active matrix substrate, the second switching elements are connected to the plurality of draw-out lines connecting the gate bus lines or the data bus lines and the mounting terminal, and the third switching elements are connected to the end portions of the gate bus lines or the data bus lines to which the mounting terminal is not connected. Each second switching element is connected to the first common wire, and each third switching element is connected to the second common wire. With this configuration, elements and wires can be distributed both to a section where the mounting terminal is connected to the gate bus lines or the data bus lines and to a section where the mounting terminal is not connected thereto. In this way, such elements and wires can be efficiently installed. As a result, the configurations at the mounting terminal side, such as the configuration of the first common wire, can be simplified. Furthermore, signals can be transmitted not only to the gate bus lines or the data bus lines, but also to the draw-out lines connecting the mounting terminal and the gate bus lines or the data bus lines, under control by second and third switching element signals.

On the aforementioned active matrix substrate, the first common wire may be connected to all of the plurality of second switching elements. In this way, a signal can be supplied to the second switching elements as long as a minimum of one first common wire is provided. Therefore, the wiring configurations at the mounting terminal side can be simplified more easily.

On the aforementioned active matrix substrate, the second common wire may be constituted by a plurality of second common wires, and a predetermined number of the third switching elements may be connected to each of the plurality of second common wires. In this way, operation processing, such as inspection processing and voltage application processing, can be performed per predetermined number using the second common wires, and the configuration of the first common wire at the mounting terminal side can be simplified more easily.

On the aforementioned active matrix substrate, the mounting terminal and the plurality of second switching elements can be arranged in a mounting region in which the driver is mounted. In this way, the second switching elements can be organized within the driver mounting region in a compact manner, and efficient arrangement can be achieved as well.

On the aforementioned active matrix substrate, among the plurality of draw-out lines, one of two neighboring draw-out lines can be formed from the same conductive layer as the gate bus lines, and the other of the two neighboring draw-out lines can be formed from the same conductive layer as the data bus lines. In this case, the occurrence of a short circuit and disconnection of the draw-out lines can be inhibited even if the draw-out lines are arranged in high density.

On the aforementioned active matrix substrate, the one and the other of the neighboring draw-out lines can be cross-connected to the same conductive layer at the mounting terminal, and connected to the first common wire by way of the same conductive layer. In this way, the mounting terminal doubles as a cross-connection portion, and therefore it is not necessary to provide the cross-connection portion separately. Furthermore, as the plurality of draw-out line are connected to the common wire in the same layer, the configuration of the common wire can be simplified as well.

On the aforementioned active matrix substrate, second switching elements that are connected to the data bus lines via the draw-out lines and second switching elements that are connected to the gate bus lines via the draw-out lines can be arranged in one mounting region or in a plurality of neighboring mounting regions, and can be connected to the same control wire. In this way, the second switching elements can be easily aggregated, and the control wire can be easily simplified.

On the aforementioned active matrix substrate, it is preferable that an oxide semiconductor be used for both the first and second switching elements. In this case, high-performance and compact switching elements can be easily constructed, and signal control using the second switching elements can be performed with high precision.

A display apparatus according to an embodiment of the present invention incorporates any one of the aforementioned active matrix substrates. In such a display apparatus, wires and elements outside a display region can be efficiently installed while preserving their functions, even if a region for mounting the driver is small. Accordingly, the high-performance and compact display apparatus can be easily constructed.

The following describes preferred embodiments of an active matrix substrate and a display apparatus of the present invention with reference to the drawings. It should be noted that the following description will be given using an example case in which the present invention is applied to a transmissive liquid crystal display apparatus. Furthermore, the dimensions of constituent elements in the drawings are not precise representations of the actual dimensions of the constituent elements, the actual dimensional ratios of the constituent elements, etc.

First Embodiment

Example Configuration of Display Apparatus

FIG. 1 is a diagram for describing a liquid crystal display apparatus incorporating an active matrix substrate according to a first embodiment of the present invention. In FIG. 1, a liquid crystal display apparatus 1 according to the present embodiment includes a liquid crystal panel 2 and a backlight apparatus 3. The liquid crystal panel 2 is arranged with an upper side thereof in FIG. 1 serving as a viewing side (a display surface side). The backlight apparatus 3 is arranged at a non-display surface side (a lower side in FIG. 1) of the liquid crystal panel 2, and produces illumination light for illuminating the liquid crystal panel 2.

The liquid crystal panel 2 includes a counter substrate 4 and an active matrix substrate 5 of the present invention, which constitute a pair of substrates, as well as polarizing plates 6 and 7 that are provided on the outer surfaces of the counter substrate 4 and the active matrix substrate 5, respectively. A later-described liquid crystal layer is held between the counter substrate 4 and the active matrix substrate 5. Planar, transparent glass material or transparent synthetic resin, such as acrylic resin, is used for the counter substrate 4 and the active matrix substrate 5. Resin films made from triacetyl cellulose triacetate (TAC), polyvinyl alcohol (PVA), or the like are used for the polarizing plates 6, 7. The polarizing plates 6, 7 are each attached to a corresponding one of the counter substrate 4 and the active matrix substrate 5 so as to cover at least an effective display region on a display surface of the liquid crystal panel 2. There are cases in which a λ/4 retarder (a quarter wave plate) is arranged between the polarizing plates 6, 7 and the liquid crystal layer.

The active matrix substrate 5 is one of the aforementioned pair of substrates. Pixel electrodes, thin-film transistors (TFTs), and the like are formed between the active matrix substrate 5 and the aforementioned liquid crystal layer in correspondence with a plurality of pixels included in the display surface of the liquid crystal panel 2 (the details will be described later). On the other hand, the counter substrate 4 is the other of the pair of substrates (counter substrate), and includes color filters, a counter electrode, and the like that are formed so as to oppose the aforementioned liquid crystal layer (not shown).

The liquid crystal panel 2 is also provided with a flexible printed circuit (FPC) 8 connected to a control apparatus (not shown) that performs drive control of the liquid crystal panel 2. By operating the aforementioned liquid crystal layer on a pixel-by-pixel basis, the display surface is driven on a pixel-by-pixel basis, thereby displaying a desired image on the display surface.

It should be noted that the liquid crystal panel 2 may have any liquid crystal mode and pixel structure. The liquid crystal panel 2 may also have any driving mode. That is to say, any liquid crystal panel capable of displaying information can be used as the liquid crystal panel 2. Therefore, a detailed configuration of the liquid crystal panel 2 is not shown in FIG. 1, and a description thereof is also omitted.

The backlight apparatus 3 includes a light emitting diode 9 serving as a light source, and a light guiding plate 10 that is arranged to oppose the light emitting diode 9. Furthermore, in the backlight apparatus 3, the light emitting diode 9 and the light guiding plate 10 are held by a bezel 14 having an L-shaped cross section, with the liquid crystal panel 2 arranged above the light guiding plate 10. A case 11 is mounted on the counter substrate 4. In this way, the backlight apparatus 3 is attached to the liquid crystal panel 2. They are integrated as the transmissive liquid crystal display apparatus 1 in which illumination light from the backlight apparatus 3 is incident on the liquid crystal panel 2.

Synthetic resin, such as transparent acrylic resin, is used for the light guiding plate 10, and light from the light emitting diode 9 enters the light guiding plate 10. A reflecting sheet 12 is arranged at a side of the light guiding plate 10 opposite from the liquid crystal panel 2 (counter surface side). Optical sheets 13, such as a lens sheet and a diffusion sheet, are provided at the liquid crystal panel 2 side (light emitting surface side) of the light guiding plate 10. Light from the light emitting diode 9 is guided inside the light guiding plate 10 in a predetermined light guiding direction (in FIG. 1, a direction from the left side to the right side), converted into the aforementioned illumination light that is planar and has uniform luminance, and then supplied to the liquid crystal panel 2.

Although the foregoing description has introduced a configuration with the edge-lit backlight apparatus 3 having the light guiding plate 10, the present embodiment is not limited in this way, and a direct-lit backlight apparatus may be used. It is also possible to use a backlight apparatus having the light source other than the light emitting diode, such as a cold cathode fluorescent tube and a hot cathode fluorescent tube.

Specifics of the liquid crystal panel 2 according to the present embodiment will now be described, additionally with reference to FIG. 2.

Figure 2:
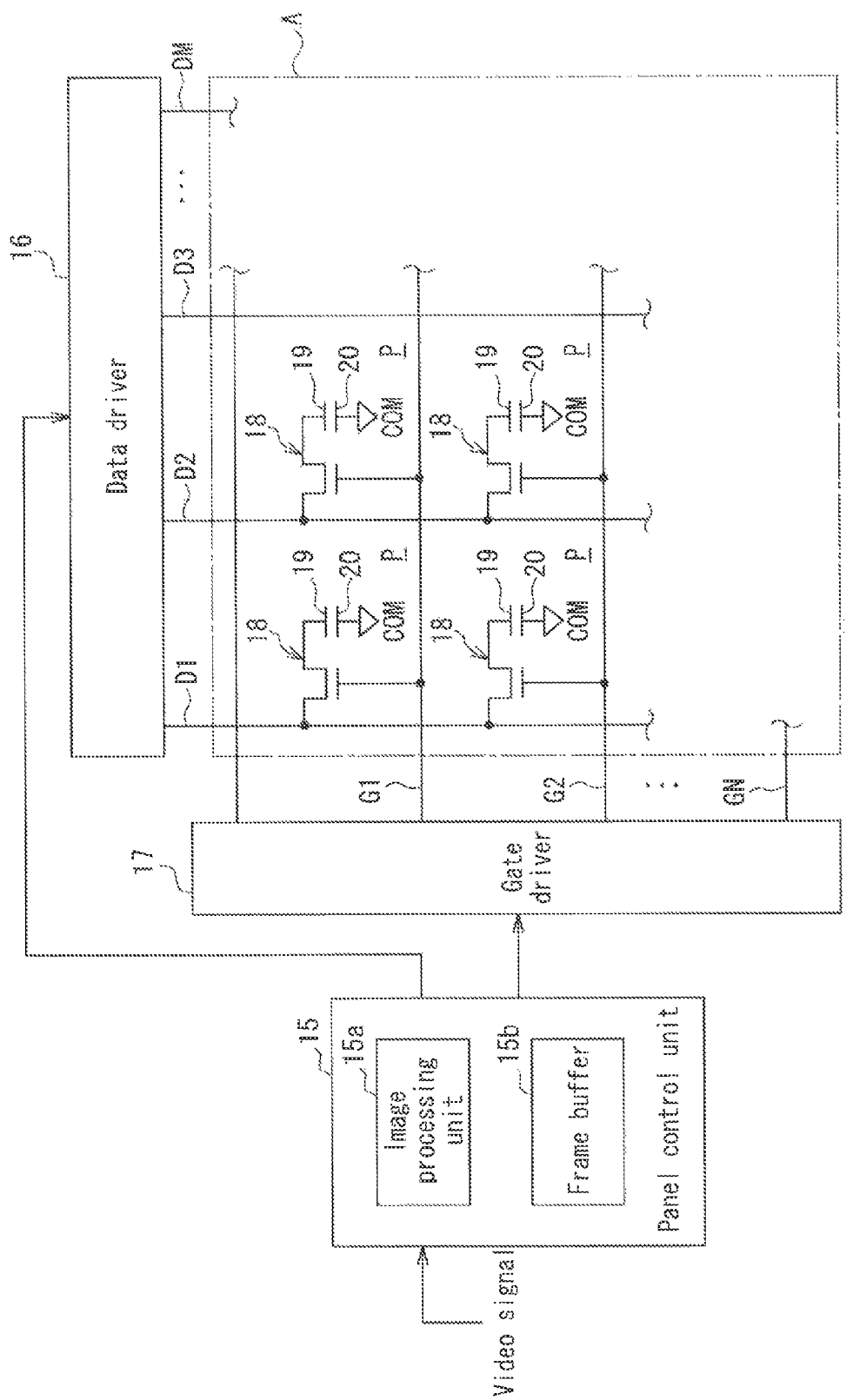
FIG. 2 is a diagram for describing a configuration of a liquid crystal panel shown in FIG. 1.

FIG. 2 is a diagram for describing a configuration of the liquid crystal panel shown in FIG. 1.

In FIG. 2, the liquid crystal display apparatus 1 (FIG. 1) is provided with a panel control unit 15 that performs drive control of the aforementioned liquid crystal panel 2 (FIG. 1) serving as a display unit for displaying information such as characters and images, as well as a data driver (source driver) 16 and a gate driver 17 that operate based on instruction signals from the panel control unit 15.

The panel control unit 15 is provided in the aforementioned control apparatus and receives, as input, a video signal from outside the liquid crystal display apparatus 1. The panel control unit 15 includes an image processing unit 15a that applies predetermined image processing to the input video signal and generates instruction signals to the data driver 16 and the gate driver 17, and a frame buffer 15b that can store display data corresponding to one frame included in the input video signal. The panel control unit 15 performs drive control of the data driver 16 and the gate driver 17 in accordance with the input video signal. As a result, information corresponding to the video signal is displayed on the liquid crystal panel 2.

The data driver 16 and the gate driver 17 are arranged on the active matrix substrate 5. Specifically, the data driver 16 is arranged on a surface of the active matrix substrate 5 so as to extend along the horizontal direction of the liquid crystal panel 2, which serves as a display panel, in a region outside an effective display region A of the liquid crystal panel 2. On the other hand, the gate driver 17 is arranged on the surface of the active matrix substrate 5 so as to extend along the vertical direction of the liquid crystal panel 2 in the region outside the aforementioned effective display region A. It should be noted that the gate driver 17 may be made up of two separate gate drivers that are provided with the effective display region A interposed therebetween, as will be described later in detail, or the gate driver 17 may be arranged so as to extend along the horizontal direction of the liquid crystal panel 2.

The data driver 16 and the gate driver 17 are drive circuits that drive a plurality of pixels P in the liquid crystal panel 2 on a pixel-by-pixel basis. The data driver 16 and the gate driver 17 are connected respectively to a plurality of data bus lines (source wires) D1 to DM (M is an integer equal to or larger than two, and hereinafter these lines are collectively referred to as "D") and a plurality of gate bus lines (gate wires) G1 to GN (N is an integer equal to or larger than two, and hereinafter these lines are collectively referred to as "G"). These data bus lines D and gate bus lines G are arrayed in a matrix pattern such that they intersect on a later-described base member that is included in the active matrix substrate 5 and is made from transparent glass material or transparent synthetic resin. That is to say, the data bus lines D are provided on the aforementioned base member in parallel to the column direction of the matrix (the vertical direction of the liquid crystal panel 2), whereas the gate bus lines G are provided on the aforementioned base member in parallel to the row direction of the matrix (the horizontal direction of the liquid crystal panel 2).

The aforementioned pixels P are provided in the vicinity of intersections between the data bus lines D and the gate bus lines G. Each pixel P includes a first thin-film transistor 18 serving as a first switching element, and a pixel electrode 19 connected to the first thin-film transistor 18. Each pixel P is structured such that a counter electrode 20 opposes the pixel electrode 19 with the aforementioned liquid crystal layer in the liquid crystal panel 2 interposed therebetween. That is to say, on the active matrix substrate 5, the first thin-film transistors 18 and the pixel electrodes 19 are provided in one-to-one relationship with the pixels.

Furthermore, on the active matrix substrate 5, regions of the plurality of pixels P are each formed in a corresponding one of regions that are defined by the data bus lines D and the gate bus lines G in a matrix pattern. The plurality of pixels P include red (R), green (G), and blue (B) pixels. The R, G, and B pixels are arranged sequentially in parallel to each of the gate bus lines G1 to GN in this order, for example. The R, G, and B pixels can display corresponding colors with a layer of the aforementioned color filters provided on the counter substrate 4.

On the active matrix substrate 5, based on an instruction signal from the image processing unit 15a, the gate driver 17 sequentially outputs scan signals (gate signals) to the gate bus lines G1 to GN for placing gate electrodes of the corresponding first thin-film transistors 18 in an on state. Based on an instruction signal from the image processing unit 15a, the data driver 16 outputs data signals (voltage signals (gradation voltages)) compliant with the luminance (gradation) of a display image to the corresponding data bus lines D1 to DM.

Example Configuration of Active Matrix Substrate

A specific example of the active matrix substrate 5 according to the present embodiment will now be described.

Figure 3:
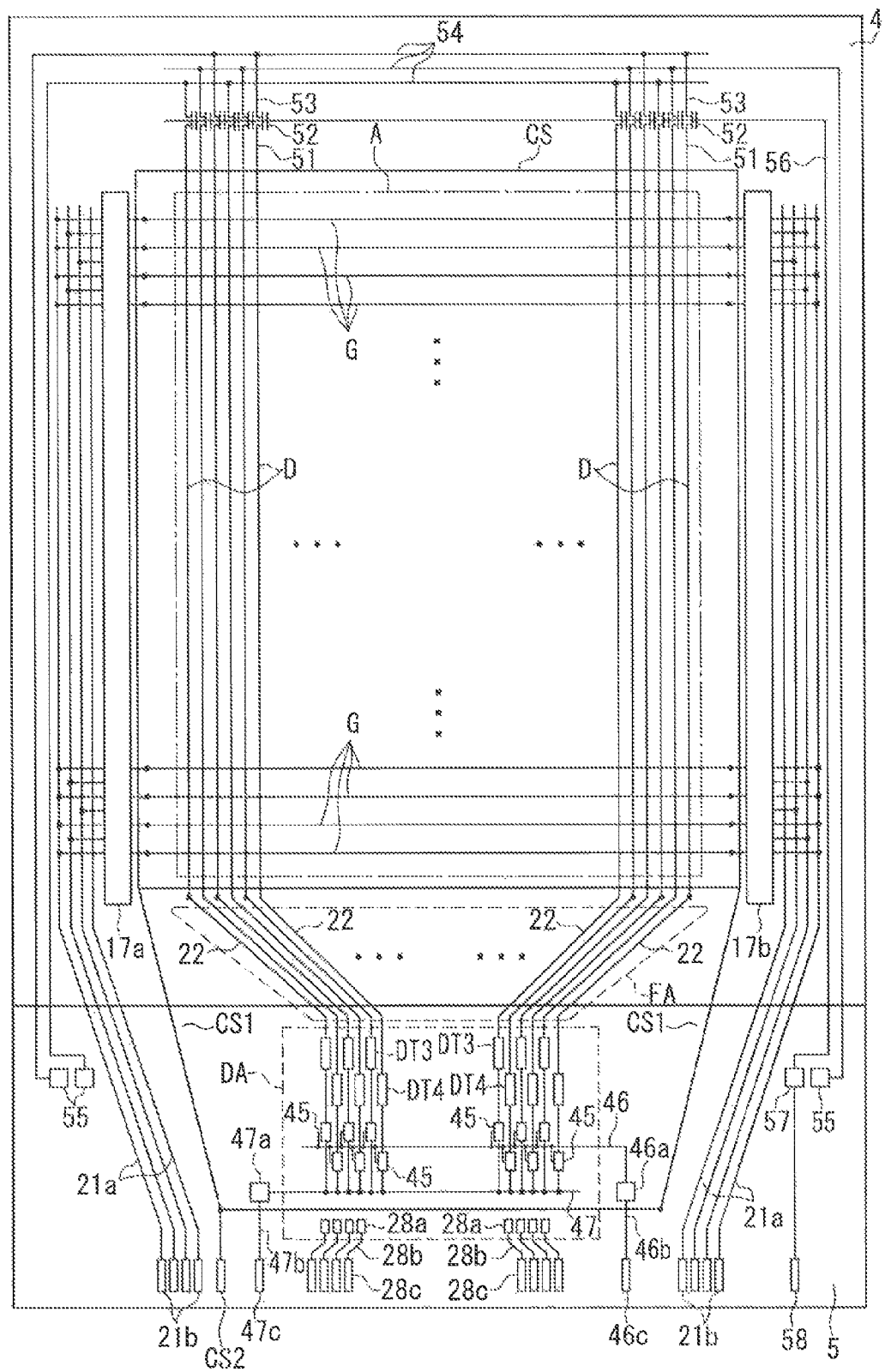
FIG. 3 is a plan view showing an example configuration of the active matrix substrate.

FIG. 3 is a plan view showing an example configuration of the active matrix substrate. In the example of FIG. 3, the active matrix substrate 5 includes a region that is covered by the counter substrate 4 (hereinafter referred to as a counter region), and a region that is not covered by the counter substrate 4 (hereinafter referred to as a non-counter region). In the counter region, the effective display region A is provided as indicated by a line with alternating long and short dashes in FIG. 3. In the effective display region A, the plurality of data bus lines D and the plurality of gate bus lines G that intersect at right angles are arrayed in a matrix pattern. In the following description, it is assumed that the data bus lines D and the gate bus lines G denote wires provided within the effective display region A. Wires that are provided outside the effective display region A and are connected to the data bus lines D or the gate bus lines G are referred to as draw-out lines and the like.

On the aforementioned base member of the active matrix substrate 5, gate drivers 17a, 17b are monolithically formed in such a manner that the effective display region A is interposed between the positions of the left and right gate drivers 17a, 17b. All of the plurality of gate bus lines G are connected to the gate driver 17a at their left end portions, and to the gate driver 17b at their right end portions. The gate drivers 17a, 17b are connected to gate driver driving signal terminals 21b via gate driver driving signal wires 21a. FPC connection terminals of the aforementioned FPC 8 are connected to the gate driver driving signal terminals 21b, and an instruction signal from the image processing unit 15a is input to the gate drivers 17a, 17b via the FPC 8.

It should be noted that the gate drivers are not limited to the aforementioned example configuration. For example, the plurality of gate bus lines G may be connected alternately to the left and right gate drivers 17a, 17b, and a gate driver may be provided only at one side of the effective display region A. Furthermore, the gate drivers 17a, 17b may be composed of an IC chip and mounted on the aforementioned base member.

On the aforementioned base member 5a of the active matrix substrate 5, an auxiliary capacitance electrode CS is provided to generate a predetermined auxiliary capacitance for each of the pixels P. The auxiliary capacitance electrode CS is connected to an auxiliary capacitance electrode driving signal terminal CS2 via auxiliary capacitance electrode driving signal wires CS1. The FPC connection terminals of the aforementioned FPC 8 are connected to the auxiliary capacitance electrode driving signal terminal CS2. The FPC 8 supplies voltage to the auxiliary capacitance electrode CS. The auxiliary capacitance electrode CS constitutes a common electrode, is made from transparent electrode material, and is provided below the pixel electrodes 19.

The data driver 16 can be composed of, for example, an IC chip (driver chip). The data driver 16 is mounted on a portion of the base member 5a of the active matrix substrate 5 outside the effective display region A. A rectangular region indicated by a dash line DA in FIG. 3 is the region for mounting the data driver. In the present example, the mounting region is located in the non-counter region. Once the data driver has been mounted, the mounting region is covered by the data driver.

In a specific example, bumps (electrodes) of the data driver 16 are connected to mounting terminals DT3, DT4 that are connected to the data bus lines D on the active matrix substrate 5, and to mounting terminals 28a for connecting to the FPC 8.

Each of the data bus lines D is connected to a corresponding one of draw-out lines 22, and each draw-out line 22 is connected to a mounting terminal DT3 or DT4. The draw-out lines 22 are arranged to be oblique with respect to the data bus lines D. That is to say, the draw-out lines are collected from the data bus lines D toward the mounting terminals DT3, DT4 that are arranged side by side in such a manner that the interval therebetween is smaller than the interval between the data bus lines D. In this way, the mounting region in which the mounting terminals DT3, DT4 are installed can be downsized. A portion in which the draw-out lines 22 are arranged to be oblique with respect to the data bus lines D in the foregoing manner is called a fan-out portion (oblique portion).

The input mounting terminals 28a at the FPC side are connected to data driver driving signal terminals 28c via data driver driving signal wires 28b. The FPC connection terminals of the aforementioned FPC 8 are connected to the data driver driving signal terminals 28c. In this way, an instruction signal from the image processing unit 15a is input to the data driver 16 via the FPC 8.

Examples of Addition of Signal Channel

The following describes example configurations for providing another channel in addition to a channel for inputting a driving signal from, for example, a driver. In the example of FIG. 3, each of the mounting terminals DT3, DT4, which are connected to the data bus lines D via the draw-out lines 22, is connected to a second thin-film transistor 45 serving as one example of a second switching element. A control line 46 for transmitting a control signal that controls on/off of the second thin-film transistors 45 is connected to the plurality of second thin-film transistors 45. The control line 46 is connected to a terminal 46a, and the terminal 46a is further connected to an input terminal 46c via a wire 46b. A first common wire 47 for transmitting a signal to be input to the data bus lines D via the plurality of second thin-film transistors 45 is connected to the second thin-film transistors 45. In the present example, one first common wire 47 is connected to all of the plurality of second thin-film transistors 45 connected to the data bus lines D. A terminal 47a is connected to the first common wire 47. The terminal 47a is connected to an input terminal 47c via a wire 47b. The FPC connection terminals of the aforementioned FPC 8 are connected to the input terminals 47c, 46c.

As described above, in the example of FIG. 3, the draw-out lines 22, the mounting terminals DT3, DT4, the second thin-film transistors 45, the first common wire 47, the terminal 47a, the wire 47b, and the input terminal 47c are sequentially connected to the data driver 16 (driver chip) side of the data bus lines D. With this configuration, a signal can be input to the data bus lines D via the second thin-film transistors 45 independently from a driving signal that is input from the driver via the mounting terminals DT3, DT4. That is to say, a signal channel that is different from a channel of signal input from the driver can be provided separately for the data bus lines D.

For example, even before the driver is mounted, an inspection signal for inspecting the data bus lines D and voltage associated with voltage application processing for alignment control and the like can be input from the terminal 47a or the input terminal 47c. In the liquid crystal display apparatus 1 as a final product, in which the driver has been mounted, the input terminal 47c is earthed via the aforementioned FPC 8, and a signal for turning off each of the second thin-film transistors 45 can be input to the input terminal 46c.

In the example of FIG. 3, third thin-film transistors 52 serving as examples of third switching elements are connected to end portions of the data bus lines D to which the mounting terminals DT3, DT4 are not connected. Each of the third thin-film transistors 52 is connected to a corresponding one of the plurality of data bus lines D. Each of the plurality of third thin-film transistors 52 is connected to one of three second common wires 54. Each of the second common wires 54 is connected to a corresponding one of terminals 55.

Specifically, the end portions of the data bus lines D to which the mounting terminals DT3 or DT4 are not connected are each drawn out to the outside of the effective display region A by a corresponding one of a plurality of draw-out lines 51. The third thin-film transistors 52 that are each connected to a corresponding one of the plurality of draw-out lines 51 are connected to the second common wires 54 via connection wires 53.

In other words, the draw-out lines 51, the third thin-film transistors 52, the connection wires 53, the three second common wires 54, and the terminals 55 are sequentially connected to the data bus lines D in a section where the mounting terminals are not provided. With this configuration, input/output of a signal can be performed with respect to the data bus lines D under control by the third thin-film transistors 52 through three channels, independently from a driving signal for the driver. It should be noted that the connection configuration of the third thin-film transistors 52 is not limited to the example of FIG. 3. For example, the third thin-film transistors 52 may be connected to the data bus lines D at the boundary of the effective display region A.

The third thin-film transistors 52 are connected to a control line 56 for transmitting a control signal for on/off control. For example, gate electrodes (not shown) of the third thin-film transistors 52 are constructed integrally with the control line 56. A terminal 57 is connected to the control line 56. The terminal 57 is also connected to an input terminal 58 via a wire. The FPC connection terminals of the aforementioned FPC 8 are connected to the input terminal 58.

For example, when performing inspection processing and voltage application processing, a control signal for performing operations to turn on/off the third thin-film transistors 52 is input from the terminal 57 or the input terminal 58, and a signal to be input to the data bus lines D is input from the terminal 55. In the liquid crystal display apparatus 1 as a final product, a signal for turning off each of the third thin-film transistors 52 is input to the input terminal 58 via the aforementioned FPC 8.

As described above, in the example of FIG. 3, the first common wire 47 is connected to the mounting terminals DT3, DT4, which are connected to the data bus lines D, via the second thin-film transistors 45, and the data bus lines D are connected to the second common wires 54 via the third thin-film transistors 52 in the section where the mounting terminals are not provided. With this configuration, wires and elements for signal channels that are independent from a channel of a signal from the driver can be distributed to the section where the mounting terminals are provided and to the section where the mounting terminals are not provided. In this way, such wires and elements can be efficiently installed. Furthermore, this configuration enables high-precision and diverse signal control in signal channels that are independent from a channel of a signal from the driver.

For example, in the example of FIG. 3, all of the second thin-film transistors 45, which are connected in the section where the mounting terminals DT3, DT4 are provided, are connected to one common wire 47, whereas each of the third thin-film transistors 52 in the section where the mounting terminals are not provided is connected to one of the plurality of second common wires 54. That is to say, a predetermined number of third thin-film transistors 52 are connected to each of the plurality of second common wires 54. By thus providing one channel in the section where the mounting terminals DT3, DT4 are provided and providing multiple channels in the section where the mounting terminals DT3, DT4 are not provided, high-precision and diverse signal control can be performed even if a region of the section where the mounting terminals DT3, DT4 are provided is small.

For example, the second common wires 54 can be provided in one-to-one relationship with the colors R, G, and B. The second common wires 54 can be connected to the data bus lines D that each correspond to one of the colors R, G, and B via the third thin-film transistors 52 on the RGB color basis. That is to say, data bus lines D corresponding to one of the colors R, G, and B are connected to a second common wire 54 that is different from second common wires 54 to which data bus lines D corresponding to the other colors are connected. In this way, for example, an inspection operation for the data bus lines D can be performed for each of the colors R, G, and B.

Meanwhile, in the example of FIG. 3, one first common wire 47 is provided at the input side of the data bus lines D (i.e., a section where the region for mounting the aforementioned driver chip is located). In an inspection operation using the first common wire 47, it is possible to detect disconnection of each of the data bus lines D and the draw-out lines 22, failures of the first thin-film transistors 18, and the like. However, this one channel alone does not enable single-color display using R, G, or B, and a short circuit between neighboring data bus lines D or between neighboring draw-out lines 22 cannot be detected. In view of this, the three second common wires 54 are provided in one-to-one relationship with the colors R, G, and B at the non-input side of the data bus lines D (a section where the mounting region is not located). This enables single-color display using R, G, or B, and detection of a short circuit between neighboring data bus lines D or between neighboring draw-out lines 22. Although disconnection of the draw-out lines 22 cannot be detected in an inspection using only the second common wires 54, disconnection of the draw-out lines 22 can be detected by carrying out the inspection in combination with an inspection using the first common wire 47.

On the active matrix substrate 5 according to the present embodiment, voltage can be applied from the second common wires 54 at the time of, for example, alignment processing for the liquid crystal layer (voltage application processing for implementing the PSA technology). In this case, a time period required for the alignment processing can be reduced by applying voltage simultaneously from the first common wire 47. It should be noted that the PSA technology is intended to form an alignment sustaining layer for pretilting liquid crystals in the absence of voltage so as to restrict the alignment direction of liquid crystal molecules in the absence of voltage. The alignment sustaining layer is formed as a polymer layer by, after forming a liquid crystal cell, photopolymerizing a photopolymerizable monomer (or oligomer) that has been mixed with liquid crystal material in advance, typically in the state where voltage is applied to the liquid crystal layer.

Specific Examples of Wire Configurations

Figure 4:
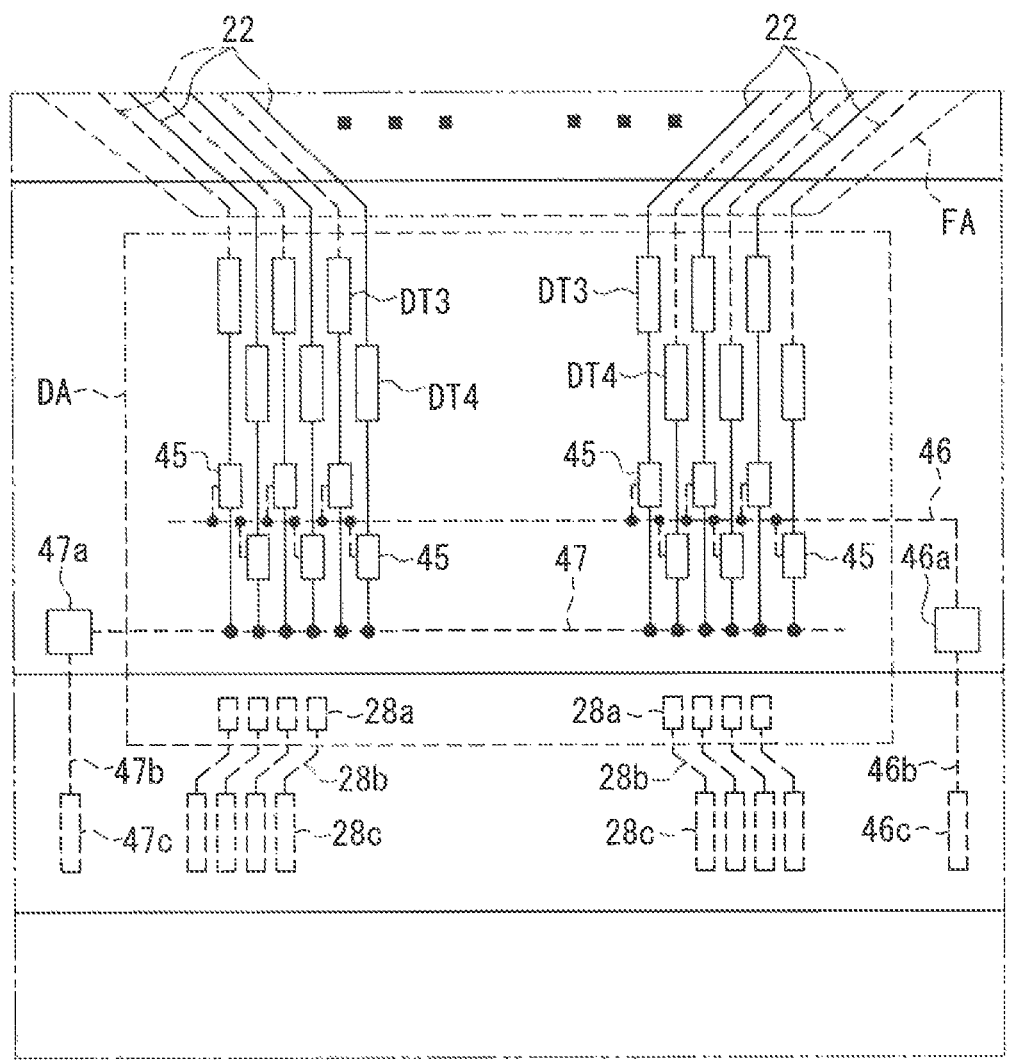
FIG. 4 is an enlarged plan view of a mounting region and the surroundings thereof shown in FIG. 3.
Figure 5:
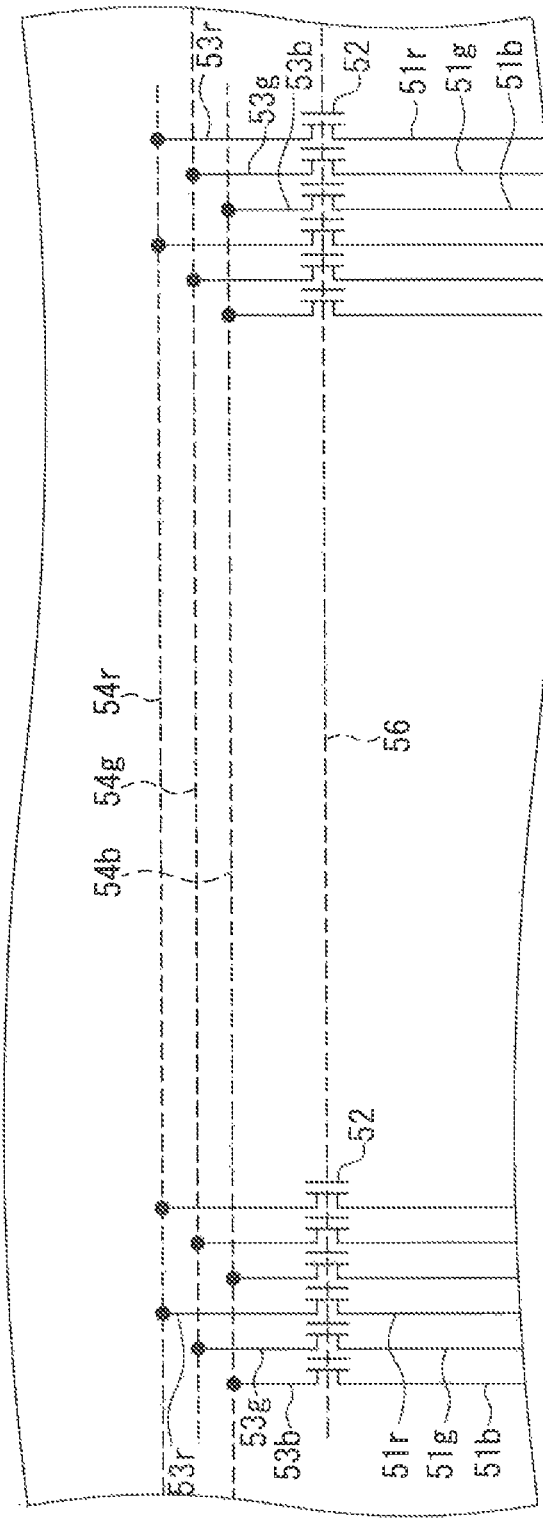
FIG. 5 is an enlarged plan view of third thin-film transistors and the surroundings thereof shown in FIG. 3.

FIG. 4 is an enlarged plan view of the region for mounting the data driver and the surroundings thereof shown in FIG. 3. FIG. 5 is an enlarged plan view of the third thin-film transistors 52 and the surroundings thereof shown in FIG. 3. In FIGS. 4 and 5, wires and terminals that are formed in a layer in which the gate bus lines G are formed (hereinafter referred to as a gate layer) are indicated by dash lines. Wires and terminals that are formed in a layer different from the layer of the gate bus lines G via an insulating film therebetween (e.g., in a layer in which the data bus lines D are formed (hereinafter referred to as a source layer)) are indicated by solid lines. The points of connection between wires formed in the source layer and wires formed in the gate layer are indicated by black dots.

In the example of FIG. 4, among the plurality of draw-out lines 22 drawn out from the data bus lines D, two neighboring draw-out lines 22 are formed in different layers. In this way, even if the interval between the draw-out lines 22 is small in the fan-out portion FA, a short circuit and disconnection of the draw-out lines do not easily occur. In particular, as the draw-out lines 22 are collected toward the mounting region, the interval between the draw-out lines 22 decreases toward the mounting region. By arranging the draw-out lines 22 alternately in different layers, the occurrence of a short circuit and disconnection between neighboring draw-out lines can be inhibited.

Neighboring draw-out lines 22 that are formed in different layers are cross-connected to the same conductive layer (here, the source layer) at the mounting terminals DT3 or DT4, and then connected to the second thin-film transistors 45. The mounting terminals DT3 or DT4 are connected to the second thin-film transistors 45 by wires cross-connected to the source layer at the mounting terminals DT3, DT4. The first common wire 47 is formed in the gate layer. Therefore, the second thin-film transistors 45 and the first common wire 47 are connected by way of contact holes for connecting wires in the source layer and connecting the source layer and the gate layer.

As such, the mounting terminals DT3, DT4 have a cross-connection function, and therefore it is not necessary to provide cross-connection portions separately. By cross-connecting the draw-out lines 22 formed in the gate layer from the gate layer to the source layer at the mounting terminals DT3, DT4, the draw-out lines 22 provided in separate layers, i.e., the gate layer and the source layer, can be kept long in the fan-out portion FA. Accordingly, the chance of a short circuit between neighboring draw-out lines 22 can be lowered. By establishing connection by way of wires in the same layer from the plurality of mounting terminals DT3, DT4 to the first common wire 47, the configurations of the plurality of second thin-film transistors 45 and the first common wire 47 can be simplified. For example, in the example of FIG. 4, in the source layer, the plurality of second thin-film transistors 45 are each connected, via the contact holes, to the first common wire 47 that is linearly formed from one line in one layer (in the present example, the gate layer) and hence has a simple configuration. By forming the control line 46 for the second thin-film transistors 45 integrally with gate electrodes of the plurality of thin-film transistors 45 formed in the gate layer, the configuration thereof can be simplified.

As described above, with the configurations shown in FIG. 4, the mounting terminals DT3, DT4, the second thin-film transistors 45, the first common wire 47, and the control line 46 can be efficiently arranged in the region for mounting the data driver 16 labeled DA.

In FIG. 5 showing example configurations of wires at the section where the mounting terminals are not provided, draw-out lines 51r, 51g, and 51b are provided in correspondence with the colors R, G, and B, respectively. The draw-out lines 51r, 51g, and 51b are connected to end portions of the data bus lines D corresponding to R, G, and B, respectively, at the non-input side (the section where the mounting terminals are not provided). Drain electrodes, not shown, of the third thin-film transistors 52 are connected to the corresponding draw-out lines 51r, 51g, 51b. Source electrodes (not shown) of the third thin-film transistors 52 are each connected to a corresponding one of second common wires 54r, 54g, and 54b, which are provided in correspondence with the colors R, G, and B, respectively, via a connection wire 53r, 53g, or 53b. All of the draw-out lines 51r, 51g, 51b and the connection wires 53r, 53g, 53b are formed so as to extend in the same direction as the data bus lines D.

All of the gate electrodes of the third thin-film transistors 52 are connected to one control line 56. Specifically, all of the gate electrodes of the third thin-film transistors 52 are formed integrally with the control line 56 in the gate layer. The second common wires 54r, 54g, and 54b are connected to the draw-out lines 51r, 51g, and 51b in correspondence with the colors R, G, and B, respectively, via the third thin-film transistors 52. That is to say, each of the second common wires 54r, 54g, 54b is connected to a predetermined number of third thin-film transistors 52 in the corresponding color R, G, or B, and to a predetermined number of data bus lines D in the corresponding color R, G, or B. In this way, the R, G, and B data bus lines D are each connected to the corresponding second common wire 54r, 54g, or 54b on the RGB color basis. Therefore, different signals can be input to the data bus lines D and independent operations can be performed for the data bus lines D on the RGB color basis.

Example Configurations of Mounting Terminals and Surroundings Thereof

Figure 6:
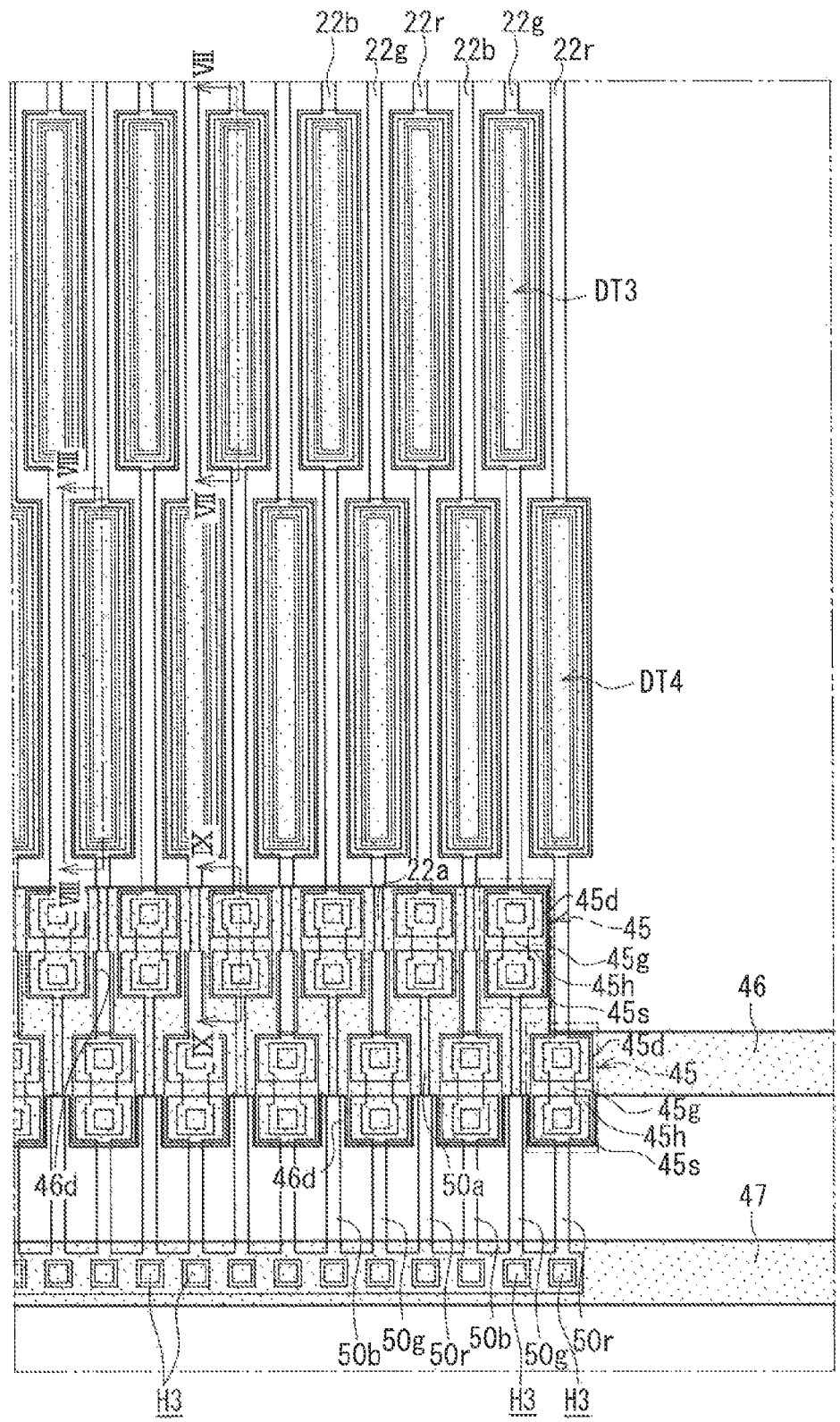
FIG. 6 shows example configurations of mounting terminals and the surroundings thereof.
Figure 7:
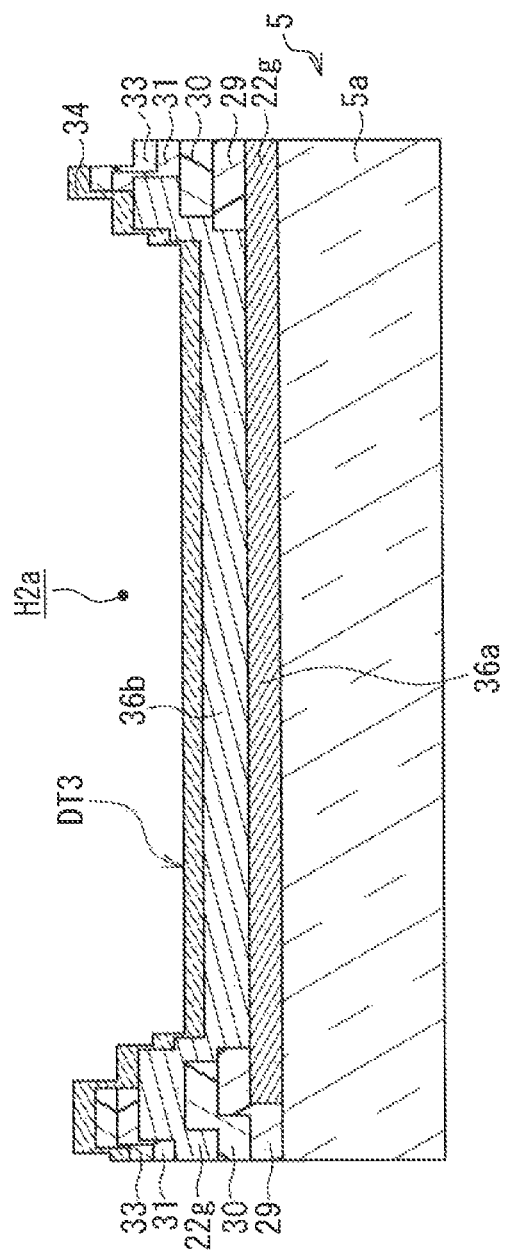
FIG. 7 is a cross-sectional view taken along the line VII-VII of FIG. 6.
Figure 8:
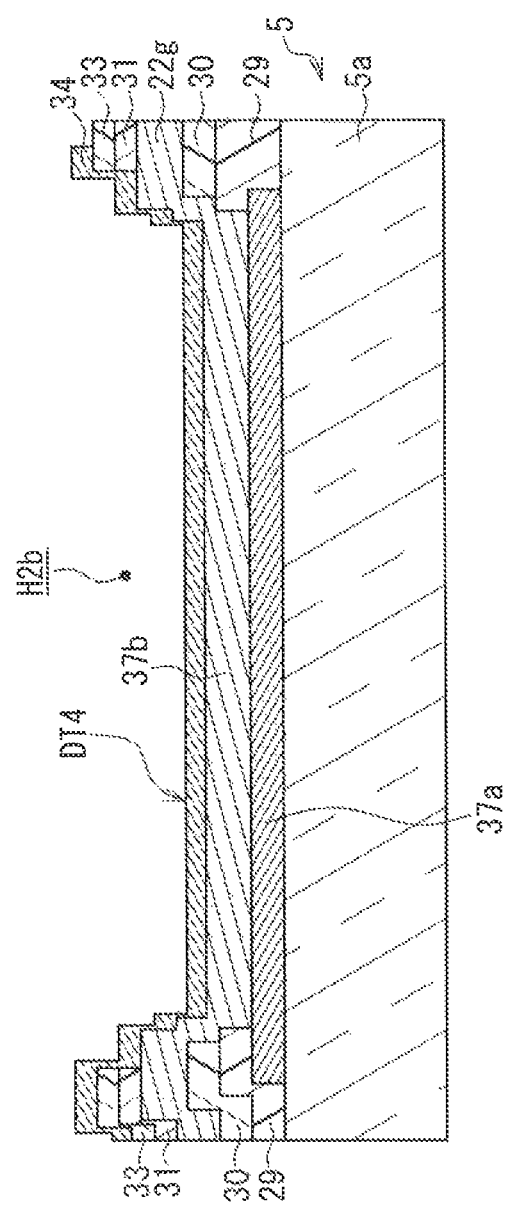
FIG. 8 is a cross-sectional view taken along the line VIII-VIII of FIG. 6.
Figure 9:
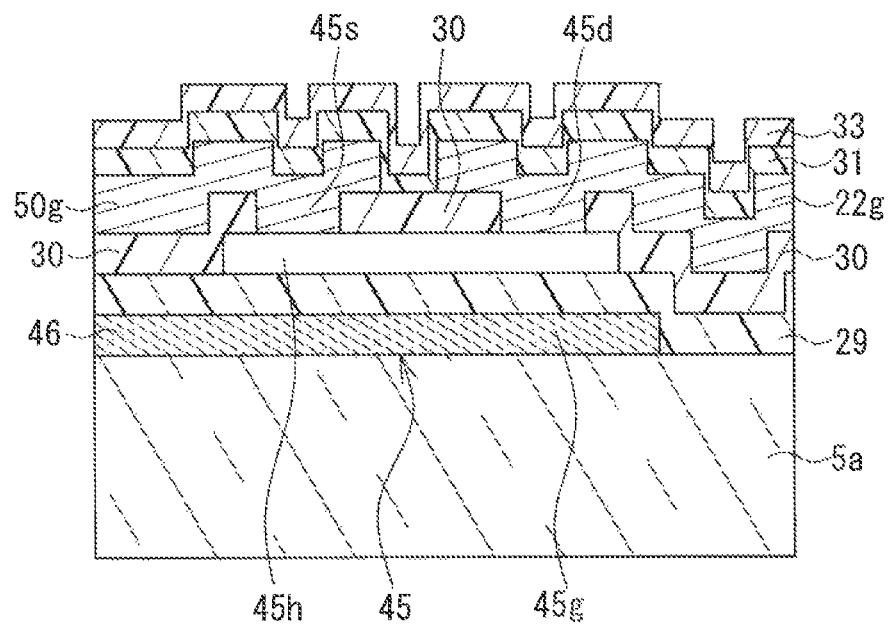
FIG. 9 is a cross-sectional view taken along the line IX-IX of FIG. 6.

FIG. 6 shows example configurations of the mounting terminals and the surroundings thereof. FIG. 7 is a cross-sectional view taken along the line VII-VII of FIG. 6. FIG. 8 is a cross-sectional view taken along the line VIII-VIII of FIG. 6. FIG. 9 is a cross-sectional view taken along the line IX-IX of FIG. 6. It should be noted that, in FIG. 6, small dots indicate sections where wires are provided in the gate layer.

In the example of FIG. 6, draw-out lines 22r, 22g, and 22b that correspond respectively to, for example, the colors R, G, and B are sequentially arrayed along the left-right direction of the figure. Each of the draw-out lines 22r, 22g, 22b is connected to the mounting terminal DT3 or DT4. The bumps (electrodes) of the data driver 16 are connected to the mounting terminals DT3, DT4. The mounting terminals DT3 and the mounting terminals DT4 are staggered in two rows. That is to say, mounting terminals DT3, DT4 connected to two neighboring draw-out lines are shifted relative to each other along the direction in which the draw-out lines extend, whereas mounting terminals connected to two draw-out lines that are arranged at both sides of one draw-out line interposed therebetween are arranged next to each other without being shifted relative to each other along the direction in which the draw-out lines extend. In this way, the plurality of mounting terminals DT3, DT4 can be efficiently installed, and the chance of the occurrence of a short circuit in the vicinity of two adjacent mounting terminals DT3, DT4 can be lowered.

Among the plurality of draw-out lines 22r, 22g, 22b, one of two neighboring draw-out lines 22 is formed from the same conductive layer as the gate bus lines G, whereas the other of the two neighboring draw-out lines 22 is formed from the same conductive layer as the data bus lines D. Specifically, one of two neighboring draw-out lines 22 is formed in the gate layer on the active matrix substrate 5, whereas the other of the two neighboring draw-out lines 22 is formed in the source layer above a gate insulating film 29 that covers the gate layer.

At the mounting terminals DT3, the draw-out lines 22 formed from the same conductive layer as the gate bus lines G are cross-connected to second lower-layer terminal electrodes formed from the same conductive layer as the data bus lines D, and then connected to drain electrodes of the second thin-film transistors. That is to say, the mounting terminals DT3 have a function for cross-connecting the draw-out lines 22 to a different layer. A specific configuration thereof will be described later with reference to FIG. 7.

Each second thin-film transistors 45 includes a drain electrode 45d connected to the draw-out line 22, and a source electrode 45s that is positioned so as to oppose the drain electrode 45d in the same layer. In a layer below the drain electrode 45d and the source electrode 45s, a semiconductor layer 45h is provided in a position where the drain electrode 45d and the source electrode 45s overlap the semiconductor layer 45h. In a layer below the semiconductor layer 45h, a gate electrode 45g is provided in a position where the semiconductor layer 45h overlaps the gate electrode 45g. The gate electrode 45g is formed integrally with the control line 46 in the gate layer. The plurality of second thin-film transistors 45 share the gate electrodes that are formed continuously with the control line 46.

In the example of FIG. 6, narrow portions 22a with small widthwise dimensions are provided in the draw-out lines 22r, 22g, 22b at portions that overlap the gate electrodes formed integrally with the control line 46. Similarly, narrow portions 50a with small widthwise dimensions are provided in the connection wires 50r, 50g, 50b at portions that overlap the gate electrodes formed integrally with the control line 46.

By thus providing the narrow portions 22a, 50a, the areas of portions in which the control line 46 overlaps the draw-out lines 22r, 22g, 22b, as well as the areas of portions in which the control line 46 overlaps the connection wires 50r, 50g, 50b, can be reduced. As a result, the active matrix substrate 5 can inhibit a signal delay in the data bus lines D, and prevent a decrease in the display quality after mounting the chip of the data driver 16 (i.e., the display quality of the liquid crystal display apparatus 1 as a final product). Furthermore, during the inspection, a delay in an inspection control signal for a control line 26 can be inhibited. Therefore, at the time of display for the inspection, unevenness in display can be easily reduced, and erroneous detection of defects can be inhibited.

In addition to the foregoing description, for example, the widthwise dimension or the installation area of the control line 26 can be reduced so as to reduce the areas of portions in which the corresponding draw-out lines 22 overlap wires for transmitting signals. For example, in the example of FIG. 6, a region sandwiched between two second thin-film transistors 45 that are arranged at both sides of one draw-out line 22 or one connection wire 50 interposed therebetween includes a portion 46d in which the control line 46 (gate electrode) is not formed. That is to say, a region sandwiched between two thin-film transistors that are installed with a draw-out line 22 or a connection wire 50 interposed therebetween can include the following portions: a portion in which the gate electrode is provided so as to facilitate transmission of a control signal between the two thin-film transistors, and a portion from which the gate electrode has been removed so as to reduce the area of a portion in which the draw-out line 22 or the connection wire 50 overlap the gate electrode.

The second thin-film transistors 45 are staggered in two rows in harmony with the mounting terminals DT3, DT4. That is to say, two thin-film transistors connected to two neighboring draw-out lines are shifted relative to each other along the direction in which the draw-out lines extend, whereas thin-film transistors connected to two draw-out lines that are arranged at both sides of one draw-out line interposed therebetween are arranged next to each other without being shifted relative to each other along the direction in which the draw-out lines extend. The second thin-film transistors 45 are shifted in harmony with the shifted mounting terminals DT3, DT4. In this way, the plurality of mounting terminals DT3, DT4 and the second thin-film transistors 45 can be efficiently installed, and the chance of the occurrence of a short circuit in the vicinity of two adjacent second thin-film transistors 45 can be lowered.

The source electrodes 45s of the second thin-film transistors 45 are each connected to one of the connection wires 50r, 50g, and 50b, which are provided in correspondence with R, G, and B, respectively. The connection wires 50r, 50g, 50b are formed in the source layer, and the first common wire 47 is formed in the gate layer. Therefore, the first common wire 47 is connected to the connection wires 50r, 50g, 50b via terminal contact holes H3.

The first common wire 47 is formed from one line that extends linearly in a direction perpendicular to the draw-out lines 22 and the connection wires 50. In a portion where the connection wires 50r, 50g, 50b overlap the first common wire 47, each of the connection wires 50r, 50g, 50b is continuous with a neighboring connection wire(s). In this way, the connection wires 50 are integrally formed along the first common electrode 47. The terminal contact holes H3 are provided in this portion where the connection wires 50 are integrally formed.

By thus connecting neighboring connection wires to each other on the first common wire 47, the resistance of the first common wire 47 can be reduced. This makes it possible to support a display apparatus with a much smaller external shape (e.g., driver mounting region). When the first common wire 47 has been disconnected, the portion in which the connection wires are connected to one another functions as an extended wire. As a result, defective products can be reduced during manufacturing.

Description of Examples of Cross-Sectional Configurations

FIG. 7 shows example configurations for cross-connecting the draw-out lines 22g that have been drawn out from the data bus lines D via the gate layer to the source layer at the mounting terminals DT3. In the example of FIG. 7, between the mounting terminal DT3 and the data bus lines D, the draw-out line 22g is formed from the same conductive layer as the gate bus lines G on the base member 5a of the active matrix substrate 5 (the right end side in FIG. 7). An end portion of the draw-out line 22g is used as a first lower-layer terminal electrode 36a in the mounting terminal DT3. In the mounting terminal DT3, a second lower-layer terminal electrode 36b, which is formed from the same conductive layer as the data bus lines D, and an upper-layer terminal electrode 34 are provided on the first lower-layer terminal electrode 36a. The second lower-layer terminal electrode 36b is connected to the drain electrode 45d (see FIG. 9) of the corresponding second thin-film transistor 45 as the draw-out line 22g. The upper-layer terminal electrode 34 can be formed from, for example, the same conductive layer as the pixel electrodes 19. In this way, the draw-out line 22 formed from the same conductive layer as the gate bus lines G is cross-connected to the draw-out line 22 formed from the same conductive layer as the data bus lines D, and then connected to the corresponding second thin-film transistor 45.

Outside the mounting terminal DT3, the gate insulating film 29, a channel protection layer 30, and interlayer insulating films 31, 33 are provided on the draw-out line 22g formed from the same conductive layer as the gate bus lines G. At the mounting terminal DT3, the first lower-layer terminal electrode 36a and the second lower-layer terminal electrode 36b are connected to each other, and the second lower-layer terminal electrode 36b and the upper-layer terminal electrode 34 are connected to each other, via a terminal contact hole H2a formed by hollowing the gate insulating film 29, the channel protection layer 30, and the interlayer insulating films 31, 33.

In this way, cross-connection of the draw-out line 22 formed from the same conductive layer as the gate bus lines G to the same conductive layer as the data bus lines D can be implemented at the terminal contact hole H2a. Accordingly, regions dedicated to such cross-connection need not be provided, and the dimension of the external shape of the active matrix substrate 5 can be easily reduced.

FIG. 8 shows example configurations for a case in which the draw-out lines 22g are formed from the same conductive layer as the data bus lines D between the data bus lines D and the mounting terminals DT4. In the example of FIG. 8, outside the mounting terminal DT4, the draw-out line 22 is provided on the gate insulating film 29 and the channel protection layer 30 that are provided on the base member 5a. In the mounting terminal DT4, a first lower-layer terminal electrode 37a is formed from the same conductive layer as the gate bus lines G on the base member 5a. The draw-out line 22g is used as a second lower-layer terminal electrode 37b in the mounting terminal DT3. The second lower-layer terminal electrode 37b is connected to the drain electrode 45d (see FIG. 9) of the corresponding second thin-film transistor 45.

In the configurations shown in FIGS. 7 and 8, in the mounting terminals DT3, DT4, the first lower-layer terminal electrodes 36a and 37a are connected respectively to the second lower-layer terminal electrodes 36b and 37b, and the second lower-layer terminal electrodes 36b and 37b are connected to the upper-layer terminal electrode 34, via the terminal contact hole H2a or H2b formed by hollowing the gate insulating film 29, the channel protection layer 30, and the interlayer insulating films 31, 33. By thus constructing the mounting terminals DT3, DT4 in the same manner regardless of the configuration of the draw-out lines 22, an inspection for the state of the data driver (driver) 16 mounted on the mounting terminals DT3, DT4 can be easily carried out.

While the connection between the driver chip of the data driver 16 and the mounting terminals DT3 or DT4 can be established, for example, via an anisotropic conductive film (ACF), there are cases in which an inspection for impression of conductive particles included in a conductive layer of the ACF is carried out as a contact inspection after mounting the driver chip. This inspection for impression is intended to measure the number of conductive particles between (bumps of) the driver chip and the mounting terminals DT3 or DT4 by observing the shapes of recesses and projections that are formed on the mounting terminals DT3 or DT4 by conductive particles from a back surface of the active matrix substrate 5. If the mounting terminals DT3 and DT4 have different film structures, the criteria of determination therefor become complicated. However, as the mounting terminals DT3 and DT4 are constructed to have the same film structure as described above, the aforementioned determination can be simplified.

FIG. 9 shows an example of a cross-sectional configuration of the second thin-film transistors 45. In the example of FIG. 9, the gate electrode 45g, which is formed integrally with the control line 46, is formed in the gate layer on the base member 5a. The insulating film 29 is formed so as to cover the gate electrode 45g, and the semiconductor layer 45h is provided above the gate electrode 45g via the insulating film 29. The channel protection layer 30 is provided so as to cover the semiconductor layer 45h. A portion of the channel protection layer 30 is removed in a section where the semiconductor layer 45h and the drain electrode 45d provided thereon overlap, and the semiconductor layer 45h and the drain electrode 45d are connected in this section. A portion of the channel protection layer 30 is removed also in a section where the semiconductor layer 45h and the source electrode 45s provided thereon overlap, and the semiconductor layer 45h and the source electrode 45s are connected in this section. The interlayer insulating films 31, 33 are provided so as to cover the drain electrode 45d and the source electrode 45s.

The source electrodes 45s of the second thin-film transistors 45 are formed in the source layer, similarly to the drain electrodes 45d. In the example of FIG. 9, the source electrode 45s constitutes an end portion of the connection wire 50g.

The semiconductor layers 45h of the second thin-film transistors 45 can be constructed from, for example, oxide semiconductors. Similarly, semiconductor layers of the first thin-film transistors 18 can be constructed from oxide semiconductors.

The gate electrodes 45g of the second thin-film transistors 45 in the aforementioned gate layer can be formed on the base member 5a, for example, using the same metal material as the gate electrodes of the first thin-film transistors 18 provided in the effective display region (a plurality of types of metal material having a single-layer or layered structure), through the same manufacturing processes as the gate electrodes of the first thin-film transistors 18. Similarly, at least one of the draw-out lines 22, the control line 46, the first lower-layer terminal electrodes 36a, 37a, and the first common wire 47 in the gate layer can also be formed using the same metal material as the gate electrodes of the first thin-film transistors 18, through the same manufacturing processes as the gate electrodes of the first thin-film transistors 18.

On the other hand, at least one of the draw-out lines 22, the second lower-layer terminal electrodes 36b, 37b, the source electrodes 45s, the drain electrodes 45d, and the connection wires 50 in the aforementioned source layer can be formed, for example, using the same metal material as the source electrodes and drain electrodes of the first thin-film transistors 18 (a plurality of types of metal material having a single-layer or layered structure), through the same manufacturing processes as the source electrodes and drain electrodes of the first thin-film transistors 18.

The foregoing embodiment is illustrative in its entirety, and the present invention is not limited to the foregoing embodiment. For example, although the second thin-film transistors 45, the third thin-film transistors 52, the first common wire 47, and the second common wires 54 are connected to the data bus lines D in the foregoing example, they may be connected to the gate bus lines instead of the data bus lines.

Second Embodiment

Figure 10:
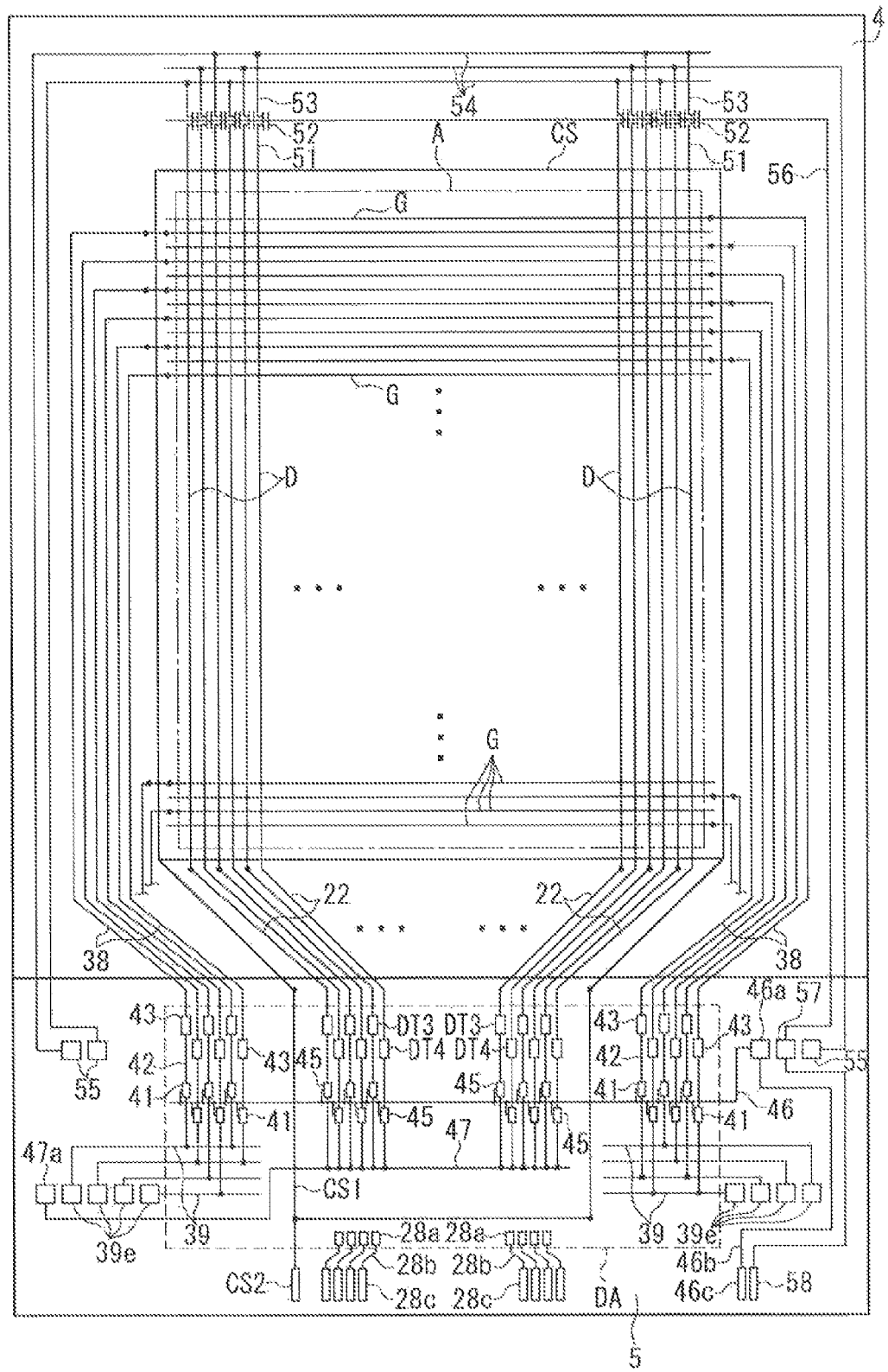
FIG. 10 shows an example configuration of an active matrix substrate according to a second embodiment of the present invention.

FIG. 10 shows an example configuration of an active matrix substrate according to a second embodiment of the present invention. The first embodiment described earlier pertains to an example configuration in which the gate drivers are monolithically formed on the active matrix substrate 5. In contrast, the present embodiment pertains to an example configuration in which one driver chip is equipped with both of a gate driver and a data driver. Therefore, in an example configuration shown in FIG. 10, mounting terminals connected to data bus lines D and mounting terminals connected to gate bus lines G are arranged side by side in a non-counter region. The mounting terminals connected to the data bus lines D and the mounting terminals connected to the gate bus lines G are arranged in one driver mounting region. In FIG. 10, a rectangular region indicated by a dash line DA is the driver mounting region.

The driver chip (not shown) into which the gate driver and the data driver are integrated is mounted in this mounting region. It should be noted that the gate driver and the data driver may each be constructed from an independent driver chip. In this case, a region for mounting the gate driver and a region for mounting the data driver are arranged side by side.

Similarly to the first embodiment described earlier, each of the plurality of data bus lines D is connected to a corresponding one of draw-out lines 22, and each of the draw-out line 22 is connected to a corresponding one of mounting terminals DT3 or DT4. The mounting terminals DT3 or DT4 are connected to second thin-film transistors 45. All of the plurality of second thin-film transistors 45 are connected to one common wire. A control line 46 for transmitting a control signal to the second thin-film transistors 45 is connected to gate electrodes of the plurality of second thin-film transistors 45. A first common wire 47 is connected to a terminal 47a, and the terminal 47a may be further connected to an input terminal (not shown) via a wire (not shown). The control line 46 is connected to a terminal 46a, and the terminal 46a is further connected to an input terminal 46c via a wire 46b. It should be noted that the control line 46 is also connected to gate electrodes of second thin-film transistors 41 connected to the gate bus lines G.

Similarly to the first embodiment described earlier, each of the plurality of data bus lines D is connected to one of a plurality of second common wires 54 via a corresponding one of third thin-film transistors 52 in a section where the mounting terminals DT3, DT4 are not provided. A control line 56 is connected to gate electrodes of the third thin-film transistors 52. With this configuration, a single-channel signal path for the data bus lines is added in a section where the mounting terminals are provided, whereas a multiple-channel signal path for the data bus lines is added in a section where the mounting terminals are not provided.

Draw-out lines 38 are connected to the plurality of gate bus lines G. Among the gate bus lines G, a gate bus line G that is connected to the draw-out line 38 at one end thereof (the left side of an effective display region A) and a gate bus line G that is connected to the draw-out line 38 at the other end thereof (the right side) are arrayed in an alternating manner. The draw-out lines 38 extend through regions located on the left and right of the effective display region A, and are then connected to mounting terminals 43 in the non-counter region. The mounting terminals 43 connected to the gate bus lines G are arranged at both sides of the mounting terminals DT3, DT4 connected to the data bus lines D. That is to say, in the non-counter region, the mounting terminals DT3, DT4 are arranged in a central portion at the effective display region side, and the mounting terminals 43 are arranged side by side on the left and right of the mounting terminals DT3, DT4. Therefore, the draw-out lines 38 connected to the left side of the gate bus lines are connected to the mounting terminals 43 arranged on the left of the mounting terminals DT3, DT4 for the data bus lines, whereas the draw-out lines 38 connected to the right side of the gate bus lines are connected to the mounting terminals 43 arranged on the right of the mounting terminals DT3, DT4.

The second thin-film transistors 41 for the gate bus lines are connected to the mounting terminals 43. Each of the second thin-film transistors 41 is connected to one of a plurality of (in the present example, four) first common wires 39. The first common wires 39 are connected to terminals 39e. The control line 46 is connected to the plurality of second thin-film transistors 41. As stated earlier, the control line 46 is also connected to the second thin-film transistors 45 for the data bus lines. With this configuration, a signal can be input to the gate bus lines G via the second thin-film transistors 41 independently from a driving signal that is input from a driver via the mounting terminals 43. That is to say, a signal channel that is different from a channel of signal input from a driver can be provided separately for the gate bus lines G.

In the example configuration shown in FIG. 10, with respect to the data bus lines D, a multiple-channel signal path is added in the section where the mounting terminals are not provided, and a single-channel signal path is added in the section where the mounting terminals are provided; on the other hand, with respect to the gate bus lines G, a multiple-channel signal path is added in each of the left and right side. This configuration makes it possible to efficiently install wires and elements for signal channels that are independent from a channel of a signal from a driver, and also to achieve high-precision and diverse signal control in signal channels.

For example, in a region in the vicinity of the mounting terminals DT3, DT4 for the data bus lines D, installation of common electrode signal lines, such as auxiliary capacitance electrode driving signal wires CS1, makes it difficult to secure the space for an additional signal channel. In this case, an auxiliary capacitance electrode driving signal terminal CS2 is often formed near the mounting terminals for the data bus lines D so as to prevent an increase in the resistance of the auxiliary capacitance electrode driving signal wires CS1 (i.e., so as to prevent an increase in the length of the wires). Therefore, in many cases, common electrode signal lines are not arranged in the vicinity of the mounting terminals for the gate bus lines G. In view of this, as shown in FIG. 10, a multiple-channel signal path is added in the vicinity of the mounting terminals for the gate bus lines G. In this way, higher-precision and more diverse signal control is enabled, and in a section where the mounting terminals DT3, DT4 for the data bus lines D are provided, the configurations can be simplified thanks to one channel.

It should be noted that the mode for adding a signal channel is not limited to the example of FIG. 10. The mode of an additional signal channel for the data bus lines or the gate bus lines can be modified in accordance with common electrode signals and the arrangement of the mounting terminals. For example, with respect to the gate bus lines G, it is possible to add one channel to one of the left and right groups of mounting terminals 43, and to add multiple channels to the other of the left and right groups of mounting terminals 43. It is also possible to add one channel to one side and multiple channels to the other side, with respect to both of the gate bus lines G and the data bus lines D.

Specific Examples of Wire Configurations

Figure 11:
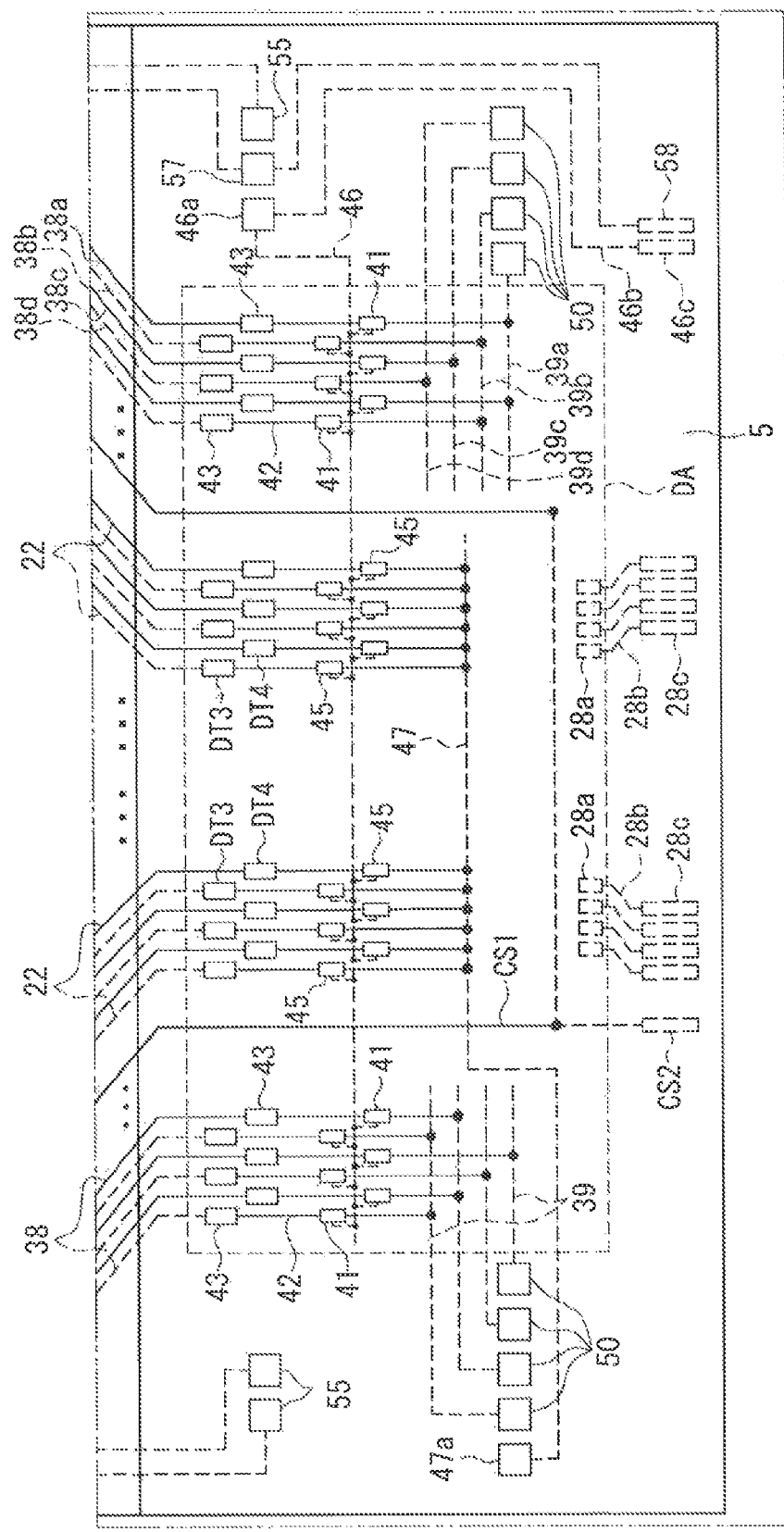
FIG. 11 is an enlarged view of a non-counter region in FIG. 10.

FIG. 11 is an enlarged view of the non-counter region of an active matrix substrate 5 shown in FIG. 10. In FIG. 11, the draw-out lines 22, the mounting terminals DT3, DT4, the second thin-film transistors 45, and the first common wire 47 that are connected to the data bus lines D can be constructed in the same manner as their counterparts in the first embodiment shown in the example of FIG. 3. In FIG. 11, wires and terminals formed in a gate layer are indicated by dash lines, whereas wires and terminals formed in a source layer are indicated by solid lines. The points of connection between wires formed in the source layer and wires formed in the gate layer are indicated by black dots.

As shown in FIG. 11, the draw-out lines 38 between the gate bus lines G and the mounting terminals 43 include draw-out lines formed from the same conductive layer as the gate bus lines G, and draw-out lines formed from the same conductive layer as the data bus lines D. That is to say, among two neighboring draw-out lines (e.g., 38a and 38b) included in the draw-out lines 38, one (38b) is formed in the gate layer, whereas the other (38a) is formed in the source layer. The draw-out lines 38b, 38d formed in the gate layer are cross-connected to the source layer at the mounting terminals 43.

The mounting terminals 43 are connected to the corresponding second thin-film transistors 41 by wires formed in the source layer. The gate electrodes of the second thin-film transistors 41 are connected to the control line 46 formed in the gate layer. In the example of FIG. 11, all of the gate electrodes of the second thin-film transistor 41 connected to the gate bus lines G are connected to one control line 46. The control line 46 is formed so as to extend linearly in a direction of side-by-side arrangement of the mounting terminals 43 for the gate bus lines and the mounting terminals DT3, DT4 for the data bus lines. The control line 46 is also connected to all of the gate electrodes of the second thin-film transistors 45 connected to the data bus lines D. By thus providing the control line 46 that extends across the mounting region and arranging the second thin-film transistors 41, 45 along the control line 46, efficient arrangement can be achieved.

Each of the second thin-film transistors 41 is connected to one of a plurality of (in the present example, four) first common wires 39a, 39b, 39c, 39d. That is to say, the plurality of first common wires are provided, and each of the first common wires is connected to a predetermined number of second thin-film transistors 41. In this way, different signals can be input per predetermined number of second thin-film transistors 41.

In the example of FIG. 11, the plurality of first common wires are provided, and two second thin-film transistors 41 that are connected respectively to two neighboring draw-out lines among the draw-out lines 38 formed in the same layer are each connected to a different one of the first common wires 39.

Specifically, the draw-out lines 38b and 38d are both formed from the same conductive layer as the gate bus lines G, but these draw-out lines 38b and 38d are connected respectively to different first common wires 39b and 39d. The draw-out lines 38a and 38c are both formed from the same conductive layer as the data bus lines D, but these draw-out lines 38a and 38c are connected respectively to different first common wires 39a and 39c.

Accordingly, for example, an inspection operation to check whether a short circuit has occurred between neighboring wires can be easily performed by using the first common wires 39 with respect to the draw-out lines 38 formed from the same conductive layer as the gate bus lines G, as well as the draw-out lines 38 formed from the same conductive layer as the data bus lines D.

With the configuration shown in FIG. 11, the mounting terminals 43, the second thin-film transistors 41, and the first common wires 39 for the gate bus lines G can be efficiently arranged in the driver mounting region, in addition to the mounting terminals DT3, DT4, the second thin-film transistors 45, and the first common wire 47 for the data bus lines D.

Example Configurations of Mounting Terminals and Surroundings Thereof

Figure 12:
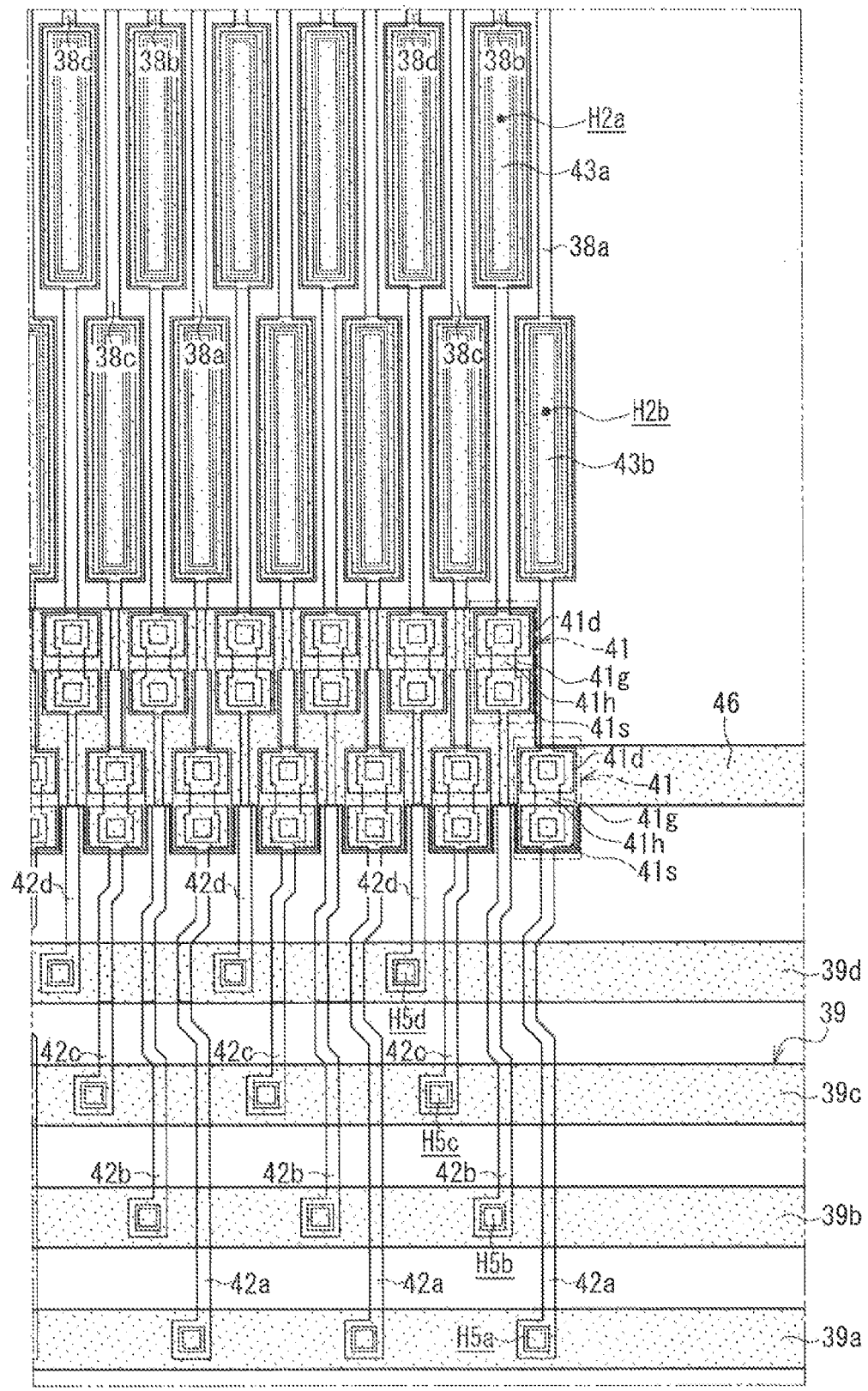
FIG. 12 shows example configurations of mounting terminals for gate bus lines and the surroundings thereof.

FIG. 12 shows example configurations of the mounting terminals 43 for the gate bus lines and the surroundings thereof. In FIG. 12, the mounting terminals 43a can be constructed similarly to their counterparts in FIGS. 6 and 7, and the mounting terminals 43b can be constructed similarly to their counterparts in FIGS. 6 and 8. Drain electrodes 41d, source electrodes 41s, semiconductor layers 41h, and gate electrodes 41g of the second thin-film transistors 41 in FIG. 12 can be constructed similarly to their counterparts in FIGS. 6 and 9.

Connection wires 42a, 42b, 42c, 42d are connected to the source electrodes 41s of the second thin-film transistors 41. The connection wires 42a, 42b, 42c, and 42d formed in the source layer are connected to the first common wires 39a, 39b, 39c, and 39d formed in the gate layer via terminal contact holes H5a, H5b, H5c, and H5d, respectively.

Specifically, the four first common wires 39a, 39b, 39c, 39d that extend in a direction perpendicular to the draw-out lines 38 or the connection wires 42 are sequentially arranged side by side. The first common wire 39a and the first common wire 39c, which neighbors the first common wire 39a with one first common wire interposed therebetween, are connected to a predetermined number of second thin-film transistors 41 via a predetermined number of terminal contact holes H5a, H5c and the connection wires 42a, 42c in the source layer. The predetermined number of second thin-film transistors 41 are connected to a predetermined number of gate bus lines G by way of the mounting terminals 43b and the draw-out lines 38a, 38c in the source layer.

The common wires 39b and 39d, which respectively neighbor the first common wires 39a and 39c, are connected to the mounting terminals 43a by way of a predetermined number of terminal contact holes H5b, H5d, connection wires 42b, 42d in the source layer, and a predetermined number of second thin-film transistors 41, cross-connected to the draw-out lines 38b, 38d in the gate layer at the mounting terminals 43a, and then connected to a predetermined number of gate bus lines G.

In this way, two neighboring draw-out lines (i.e., 38a and 38b, 38b and 38c, 38c and 38d, and 38d and 38a) are connected respectively to two neighboring first common wires (39a and 39b, 39b and 39c, 39c and 39d, and 39d and 39a). Two neighboring draw-out lines in the same layer (38a and 38c, and 38b and 38d) are connected respectively to two different first common wires (39a and 39c, and 39b and 39d).

Effects Achieved by Embodiments

In the first and second embodiments described earlier, the third thin-film transistors (third switching elements) 52 and the second common wires 54 are provided. The third thin-film transistors 52 are connected to end portions of the data bus lines D to which the mounting terminals DT3 or DT4 are not connected, and the second common wires 54 are connected in common to the plurality of third thin-film transistors 52. In this way, the configurations in a section where the mounting terminals DT3 or DT4 are provided, such as the configuration of the aforementioned first common wire 47, can be simplified. As a result, the second thin-film transistors (second switching elements) 45 can be installed more easily even if the driver mounting region is small. Furthermore, the embodiments described earlier can downsize the driver mounting region. This makes it possible to further downsize the external shape of the active matrix substrate 5, and hence the external shape of the liquid crystal display apparatus 1. Furthermore, the resistance of auxiliary capacitance electrode driving signal wires CS1 for an auxiliary capacitance electrode (common electrode) CS can be reduced by increasing a region for installing the auxiliary capacitance electrode driving signal wires CS1, i.e., by thickening the auxiliary capacitance electrode driving signal wires CS1. As a result, the occurrence of defective display, such as flickering and shadowing, attributed to a delay in signals (voltage signals) to the auxiliary capacitance electrode CS can be inhibited.

For example, as in the configuration shown in FIG. 3, the active matrix substrate 5 is provided with a single-channel signal path via the thin-film transistors 45 in a section where the mounting terminals are provided, in addition to a signal path having two or more channels via the third thin-film transistors 52, which is formed at the non-input side (in a section where the mounting terminals are not provided) with respect to the data bus lines or the gate bus lines. This enables control of input/output of signals over a range covering not only the data bus lines or the gate bus lines but also the draw-out lines, even if the external shape of the display apparatus (e.g., the driver mounting region) is small.

The following describes the effects achieved when an inspection is carried out using an added channel as one example. For example, an inspection for disconnection of the draw-out lines between the data bus lines or the gate bus lines and the mounting terminals cannot be carried out in the case where a signal path having two or more channels has been added in the section where the mounting terminals are not provided, but a signal input path for the inspection has not been added in the section where the mounting terminals are provided. In contrast, by adding a single-channel signal path in the section where the mounting terminals are provided and adding a signal path having two or more channels in the section where the mounting terminals are not provided as in the present embodiments, disconnection of the draw-out lines can be detected.

It is also possible to install a shorting bar that connects the draw-out lines in the section where the mounting terminals are provided, and to add a signal input path having two or more channels in the section where the mounting terminals are not provided, for the purpose of detecting disconnection of the draw-out lines. In this case, it is necessary to provide a process for cutting the shorting bar and the mounting terminals by, for example, laser cutting after the inspection. In contrast, the present embodiments do not require such cutting. Furthermore, a region for installing the second thin-film transistors 45 is smaller than a region that is required when such laser cutting is performed. For example, while a width of approximately 200 μm is required when such laser cutting is performed, a region for installing the second thin-film transistors 45 is approximately 78 μm in the example of FIG. 6.

Other Modification Examples

It should be noted that the embodiments described earlier are all illustrative and not restrictive. The technical scope of the present invention is defined by the claims, and all changes that come within the range of equivalency of the configurations described in the claims are to be embraced within the technical scope of the present invention.

For example, the plurality of first common wires 47 may be provided. That is to say, the first common wire(s) may be connected to at least two of the plurality of second thin-film transistors 45. Furthermore, the number of the second common wires 54 is not limited to three, and the number of the first common wires 39 is not limited to four.

The second thin-film transistors and the first common wire(s) may be provided in the fan-out portion, or between the mounting terminals and the fan-out portion. Furthermore, the configuration of the mounting terminals is not limited to that of the aforementioned examples. Instead of implementing cross-connection at the mounting terminals, cross-connection portions may be provided separately. Moreover, the upper-layer terminal electrodes of the mounting terminals may cover portions of the second thin-film transistors connected to the mounting terminals.

Although the data bus lines D are provided on the gate bus lines G via the gate insulating film 29 in the aforementioned example, the data bus lines D and the gate bus lines G may be reversed, i.e., the gate bus lines G may be provided on the data bus lines D via the insulating film. Although the bus lines G extending in the horizontal direction of the sheet are the gate bus lines and the bus lines D extending in the vertical direction of the sheet are the data bus lines in the aforementioned example, they may be reversed. For example, in FIG. 10, the bus lines labeled G (the bus lines extending in the horizontal direction of the sheet) may be the data bus lines, and the bus lines labeled D (the bus lines extending in the vertical direction of the sheet) may be the gate bus lines.

Furthermore, although the mounting terminals for the data bus lines are provided at a lower side relative to the effective display region in the aforementioned examples, the positions of the mounting terminals are not limited in this way. The positions of the mounting terminals may be at least one of an upper side, a left side, and a right side relative to the effective display region.

Although the present invention is applied to a transmissive liquid crystal display apparatus in the foregoing description, an active matrix substrate of the present invention is not limited in this way. An active matrix substrate of the present invention can be applied to any display apparatus that includes an effective display region having a plurality of pixels and wires that transmit signals for driving the pixels. For example, the present invention can be adapted into an organic EL display, a microcapsule-type electrophoretic display apparatus, and other display apparatuses. A microcapsule-type electrophoretic display apparatus can display an image by, for example, applying voltage to a microcapsule layer formed in an effective display region on a pixel-by-pixel basis. A display apparatus can include, for example, a substrate provided with wires for an effective display region that are connected, via switching elements, to pixel electrodes provided in one-to-one relationship with pixels, and draw-out lines connected to the wires for the effective display region. This substrate, for example, can be constructed similarly to active matrix substrates according to the embodiments described earlier. Furthermore, an active matrix substrate of the present invention can be applied not only to such a display apparatus, but also to various types of sensor substrates, such as a sensor substrate for an X-ray detection apparatus.

Furthermore, although mounting terminals DT are staggered in two rows in the foregoing description, an active matrix substrate of the present invention is not limited in this way. For example, mounting terminals DT may be staggered in three rows (i.e., three neighboring mounting terminals DT may be sequentially shifted so as to be arranged in different positions along a linear direction).

Although the present embodiments can be applied to, for example, a liquid crystal panel of a CPA mode, which is one type of a homeotropic alignment mode (what is called a liquid crystal panel of a vertical electric field), no limitation is intended in this regard. For example, the present embodiments can also be applied to other liquid crystal panels of a homeotropic alignment mode using fishbone-type pixel electrodes, and to liquid crystal panels of a homogeneous alignment mode (what is called liquid crystal panels of a horizontal electric field).

Specifically, given an azimuth system where positive angles are taken counterclockwise starting from 0° pointing at the right side of a horizontal direction (the direction in which gate bus lines extend), a fishbone-type pixel electrode includes a plurality of elongated electrode portions (branch portions) that extend in the angles of, for example, 45°, 135°, 225°, and 315°. Between the elongated electrode portions, an elongated cutout (slit) extending in a corresponding direction is provided. A fishbone-type pixel electrode also includes a backbone portion (stem portion) that is located at a central portion of a pixel and extends along a vertical direction (the direction in which data bus lines extend). Each elongated electrode portion is connected to the backbone portion.

The direction in which the elongated electrode portions (or slits) extend varies with each of four regions that are obtained by dividing a pixel P into quarters, i.e., into two regions in both vertical and horizontal directions. As a result, at the time of voltage application, four liquid crystal alignment regions corresponding to the four regions (liquid crystal alignments in four domains) are formed within one pixel P. Within a liquid crystal domain, the alignment states of liquid crystal molecules are substantially the same. Different domains show different alignment states of liquid crystal molecules.

More specifically, when voltage is applied between a fishbone-type pixel electrode and a counter electrode 20, in each domain, liquid crystal molecules are aligned so as to be inclined parallel to the direction in which the slits extend, with their upper end portions facing the inner side of a pixel P.

In a homeotropic alignment mode using fishbone-type pixel electrodes, objects for alignment control for a counter substrate 4, such as alignment control protrusions CT, are not essential.

Furthermore, it is preferable to implement a homeotropic alignment mode using fishbone-type pixel electrodes in conjunction with the aforementioned polymer sustained alignment (PSA) technology, similarly to a CPA mode.

In a liquid crystal panel of a homogeneous alignment mode, homogeneous alignment films are provided on the inner surfaces of an active matrix substrate 5 and a counter substrate 4, and a liquid crystal layer uses liquid crystals with positive dielectric constant anisotropy. An auxiliary capacitance electrode serving as a common electrode is also used as a counter electrode. In the liquid crystal panel of the homogeneous alignment mode, the alignment of liquid crystals is controlled by forming a plurality of parallel slits (having a width of, for example, 2 μm to 4 μm) in pixel electrodes and generating a horizontal electric field between the pixel electrodes and the aforementioned counter electrode (common electrode). In the homogeneous alignment mode, it is not necessary to form the counter electrode 20 in the counter substrate 4. Furthermore, in the homogeneous alignment mode, the counter electrode serving as the common electrode is made from transparent electrode material and is provided below the pixel electrodes, similarly to the auxiliary capacitance electrode. Moreover, in the homogeneous alignment mode, there is a case in which the counter electrode serving as the common electrode is provided above the pixel electrodes, unlike the auxiliary capacitance electrode. In this case, the aforementioned slits are not formed in the pixel electrodes, and a plurality of parallel slits (having a width of, for example, 2 μm to 4 μm) are formed in the counter electrode.

Although upper-layer terminal electrodes 34 of mounting terminals DT are formed from the same conductive layer as pixel electrodes 19 in the foregoing description, an active matrix substrate of the present invention is not limited in this way. Upper-layer terminal electrodes and pixel electrodes may be formed from different conductive layers. For example, in a liquid crystal panel of a homogeneous alignment mode, when a counter electrode serving as a common electrode is provided above pixel electrodes, upper-layer terminal electrodes may be formed in the same layer as the counter electrode. It is also possible to form the upper-layer terminal electrodes by newly adding a conductive layer different from the pixel electrodes and the counter electrode.

However, it is preferable to form the upper-layer terminal electrodes and the pixel electrodes from the same conductive layer, as in the embodiments described earlier. In this way, an active matrix substrate with a simple configuration can be easily constructed in simple manufacturing processes.

In the first embodiment described earlier, gate drivers are monolithically formed on an active matrix substrate. In the second embodiment described earlier, a gate driver and a data driver composed of a driver chip (driver IC) are arranged on an active matrix substrate. However, an active matrix substrate of the present invention is not limited in this way. For example, in the sixth embodiment, gate drivers may be monolithically formed on an active matrix substrate.

In the foregoing description, data bus lines are provided for pixels that each correspond to one of the colors red (R), green (G), and blue (B). However, an active matrix substrate of the present invention is not limited in this way. For example, R, G, and B pixels may be sequentially provided with respect to one data bus line.

Although data bus lines are provided for pixels that each correspond to one of three colors in the foregoing description, four or more colors (e.g., R, G, B, and yellow, or R, G, B, and white) may be used. In this case, for example, four second common wires can be provided in a section where mounting terminals are not provided, and the data bus lines corresponding to the four colors can each be connected to one of the four different second common wires. In this way, a four-channel path can be added in the section where the mounting terminals are not provided.

Although thin-film transistors are used as first to third switching elements in the foregoing description, switching elements of the present invention are not limited in this way. For example, other field-effect transistors may be used.

In addition to the foregoing description, the first and second embodiments described earlier may be combined as appropriate.

INDUSTRIAL APPLICABILITY

The present invention is useful for an active matrix substrate on which second switching elements can be easily installed even if a region for mounting a driver is small, and also for a display apparatus incorporating such an active matrix substrate.

DESCRIPTION OF REFERENCE NUMERALS

1: liquid crystal display apparatus (display apparatus)
5: active matrix substrate
5a: base member
16: data driver
17, 17a, 17b: gate driver
18: first thin-film transistor (first switching element)
19: pixel electrode
22, 22r, 22g, 22b, 38, 38a, 38b, 38c, 38d: draw-out line
45, 41: second thin-film transistor (second switching element)
45d, 41d: drain electrode
45s, 41s: source electrode
45g, 41g: gate electrode
45h, 41h: semiconductor layer
47, 39, 39a, 39b, 39c, 39d: first common wire
29: gate insulating film
31, 33: interlayer insulating film
34: upper-layer terminal electrode
36a, 37a: first lower-layer terminal electrode
36b, 37b: second lower-layer terminal electrode
52: third thin-film transistor (third switching element)
54, 54r, 54g, 54b: second common wire
G, G1 to GN: gate bus line
D, D1 to DM: data bus line
DT3, DT4, 43: mounting terminal
H2a, H2b, H3, H5a, H5b, H5c, H5d: terminal contact hole
CS: auxiliary capacitance electrode (common electrode)

The invention claimed is:
1. An active matrix substrate, comprising:
a base member;
a plurality of gate bus lines provided on the base member and formed from a first conductive layer;
a plurality of data bus lines formed from a second conductive layer different from the first conductive layer via an insulating film therebetween;
a plurality of first switching elements connected to the gate bus lines and the data bus lines;
a plurality of mounting terminals that supply a signal from a driver to the gate bus lines or the data bus lines;
a plurality of draw-out data lines connecting the plurality of mounting terminals and the data bus lines;
a plurality of second switching elements that are each connected to a corresponding one of the plurality of draw-out data lines;
a first common wire connected in common to at least two of the plurality of second switching elements;
a plurality of third switching elements connected to the data bus lines on a side where the plurality of draw-out data lines are not connected; and
a second common wire connected in common to at least two of the plurality of third switching elements; wherein
among the plurality of draw-out data lines, a first one of at least two neighboring draw-out data lines is formed from the first conductive layer, and a second one of the at least two neighboring draw-out data lines is formed from the second conductive layer, and
each of the at least two neighboring draw-out data lines is cross-connected to a same conductive layer of either of the first and second conductive layers at one of the plurality of mounting terminals, and is connected to the first common wire by the same conductive layer of either of the first and second conductive layers.
2. The active matrix substrate according to claim 1, wherein
the first common wire is connected to all of the plurality of second switching elements.

3. The active matrix substrate according to claim 1, wherein
the second common wire is constituted by a plurality of second common wires, and a predetermined number of the plurality of third switching elements are connected to each of the plurality of second common wires.

4. The active matrix substrate according to claim 1, wherein
the plurality of mounting terminals and the plurality of second switching elements are arranged in a mounting region in which the driver is mounted.

5. The active matrix substrate according to claim 1, wherein
the plurality of second switching elements are connected to the draw-out data lines via the plurality of mounting terminals.

6. The active matrix substrate according to claim 1, wherein
the plurality of second switching elements connected to the data bus lines via the draw-out data lines are arranged in one mounting region or in a plurality of neighboring mounting regions, and are connected to a same control wire.

7. The active matrix substrate according to claim 1, wherein
an oxide semiconductor is used for both the first and second switching elements.

8. A display apparatus comprising the active matrix substrate according to claim 1.

9. The active matrix substrate according to claim 1, wherein
the plurality of draw-out data lines include a plurality of pairs of neighboring draw-out data lines; and
for each of the plurality of pairs of neighboring draw-out data lines:
a first one of the respective pair of neighboring draw-out data lines is formed from the first conductive layer, and a second one of the respective pair of neighboring draw-out data lines is formed from the second conductive layer; and
each of the respective pair of neighboring draw-out data lines is cross-connected to a same conductive layer of either of the first and second conductive layers at the plurality of mounting terminals, and is connected to the first common wire by the same conductive layer of either of the first and second conductive layers.

10. An active matrix substrate, comprising:
a base member;
a plurality of gate bus lines provided on the base member and formed from a first conductive layer;
a plurality of data bus lines formed from a second conductive layer different from the first conductive layer via an insulating film therebetween;
a plurality of first switching elements connected to the gate bus lines and the data bus lines;
a plurality of mounting terminals that supply a signal from a driver to the gate bus lines or the data bus lines;
a plurality of draw-out gate lines connecting the plurality of mounting terminals and the gate bus lines;
a plurality of second switching elements that are each connected to a corresponding one of the plurality of draw-out gate lines;
a first common wire connected in common to at least two of the plurality of second switching elements;
a plurality of third switching elements connected to the gate bus lines on a side where the plurality of draw-out gate lines are not connected; and
a second common wire connected in common to at least two of the plurality of third switching elements; wherein
among the plurality of draw-out gate lines, a first one of at least two neighboring draw-out gate lines is formed from the first conductive layer, and a second one of the at least two neighboring draw-out gate lines is formed from the second conductive layer, and
each of the at least two neighboring draw-out gate lines is cross-connected to a same conductive layer of either of the first and second conductive layers at the plurality of mounting terminals, and is connected to the first common wire by the same conductive layer of either of the first and second conductive layers.

11. The active matrix substrate according to claim 10, wherein
the first common wire is connected to all of the plurality of second switching elements.

12. The active matrix substrate according to claim 10, wherein
the second common wire is constituted by a plurality of second common wires, and a predetermined number of the plurality of the third switching elements are connected to each of the plurality of second common wires.

13. The active matrix substrate according to claim 10, wherein
the plurality of mounting terminals and the plurality of second switching elements are arranged in a mounting region in which the driver is mounted.

14. The active matrix substrate according to claim 10, wherein
the plurality of second switching elements are connected to the draw-out gate lines via the plurality of mounting terminals.

15. The active matrix substrate according to claim 10, wherein
the plurality of second switching elements that are connected to the gate bus lines via the draw-out gate lines are arranged in one mounting region or in a plurality of neighboring mounting regions, and are connected to a same control wire.

16. The active matrix substrate according to claim 10, wherein
an oxide semiconductor is used for both the first and second switching elements.

17. A display apparatus comprising the active matrix substrate according to claim 10.

18. The active matrix substrate according to claim 10, wherein
the plurality of draw-out gate lines include a plurality of pairs of neighboring draw-out gate lines; and
for each of the plurality of pairs of neighboring draw-out gate lines:
a first one of the respective pair of neighboring draw-out gate lines is formed from the first conductive layer, and a second one of the respective pair of neighboring draw-out gate lines is formed from the second conductive layer; and
each of the respective pair of neighboring draw-out gate lines is cross-connected to a same conductive layer of either of the first and second conductive layers at the plurality of mounting terminals, and is connected to the first common wire by the same conductive layer of either of the first and second conductive layers.

19. The active matrix substrate according to claim 10, further comprising a a plurality of draw-out data lines connecting the plurality of mounting terminals and the data bus lines; and
- a plurality of fourth switching elements are each connected to a corresponding one of the plurality of draw-out data lines;
- a third common wire connected in common to at least two of the plurality of fourth switching elements; wherein
- among the plurality of draw-out data lines, a first one of at least two neighboring draw-out data lines is formed from the first conductive layer, and a second one of the at least two neighboring draw-out data lines is formed from the second conductive layer, and
- each of the at least two neighboring draw-out data lines is cross-connected to a same conductive layer of either of the first and second conductive layers at the plurality of mounting terminals, and is connected to the third common wire by the same conductive layer of either of the first and second conductive layers.

20. The active matrix substrate according to claim 19, wherein the plurality fourth switching elements that are connected to the data bus lines via the draw-out data lines are arranged in one mounting region or in a plurality of neighboring mounting regions, and are connected to a same control wire.

* * * * *